(12) United States Patent
Takahashi et al.

(10) Patent No.: US 12,159,798 B2
(45) Date of Patent: Dec. 3, 2024

(54) TRANSFER DETECTION METHOD AND SUBSTRATE PROCESSING APPARATUS

(71) Applicant: Tokyo Electron Limited, Tokyo (JP)

(72) Inventors: Akira Takahashi, Nirasaki (JP); Atsushi Kawabe, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 719 days.

(21) Appl. No.: 17/298,768

(22) PCT Filed: Nov. 19, 2019

(86) PCT No.: PCT/JP2019/045242
§ 371 (c)(1),
(2) Date: Jun. 1, 2021

(87) PCT Pub. No.: WO2020/116150
PCT Pub. Date: Jun. 11, 2020

(65) Prior Publication Data
US 2022/0037176 A1    Feb. 3, 2022

(30) Foreign Application Priority Data

Dec. 3, 2018  (JP) ................................. 2018-226866

(51) Int. Cl.
*H01L 21/677*  (2006.01)
*H01L 21/67*   (2006.01)
*H01L 21/68*   (2006.01)

(52) U.S. Cl.
CPC .. *H01L 21/67259* (2013.01); *H01L 21/67201* (2013.01); *H01L 21/67736* (2013.01); *H01L 21/67742* (2013.01); *H01L 21/681* (2013.01)

(58) Field of Classification Search
None
See application file for complete search history.

(56) References Cited

U.S. PATENT DOCUMENTS 9,030,656 B2 * 5/2015 Kajiwara .......... H01L 21/67265
                                                       356/640
9,972,519 B2 * 5/2018 Yuk ....................... H01L 21/681
(Continued)

FOREIGN PATENT DOCUMENTS

JP     2011-155137 A    8/2011
JP     2014-93489 A     5/2014
(Continued)

*Primary Examiner* — Mark C Hageman
(74) *Attorney, Agent, or Firm* — Nath, Goldberg & Meyer; Jerald L. Meyer; Tanya E. Harkins

(57) ABSTRACT

Provided is a transfer detection method for use in a substrate processing apparatus including a transfer arm, which has a plurality of substrate holders and is configured to transfer a plurality of substrates to a plurality of stages between a first chamber and a second chamber adjacent to the first chamber by using the plurality of substrate holders, and an optical sensor provided in a vicinity of an opening via which the first and second chambers are in communication with each other, the method including: projecting a light beam having a horizontal optical axis parallel to the opening to a position through which the substrates held by the plurality of substrate holders pass; and determining at least one of a state of the substrates on the substrate holders and a state of the transfer arm, in response to a detection result of the light beam projected from the optical sensor.

9 Claims, 24 Drawing Sheets

(56) References Cited

U.S. PATENT DOCUMENTS

| | | | |
|---|---|---|---|
| 10,460,976 B2* | 10/2019 | Morikawa | H01L 21/67778 |
| 2010/0171823 A1* | 7/2010 | Yamamoto | H01L 21/681 |
| | | | 356/138 |
| 2011/0183279 A1* | 7/2011 | Okubo | H01L 21/67109 |
| | | | 432/247 |
| 2014/0126980 A1* | 5/2014 | Wamura | H01L 21/67712 |
| | | | 414/221 |

FOREIGN PATENT DOCUMENTS

| | | |
|---|---|---|
| JP | 2016-92330 A | 5/2016 |
| JP | 2017-100261 A | 6/2017 |
| KR | 1020110088425 A | 8/2011 |
| KR | 1020140058370 A | 5/2014 |

* cited by examiner

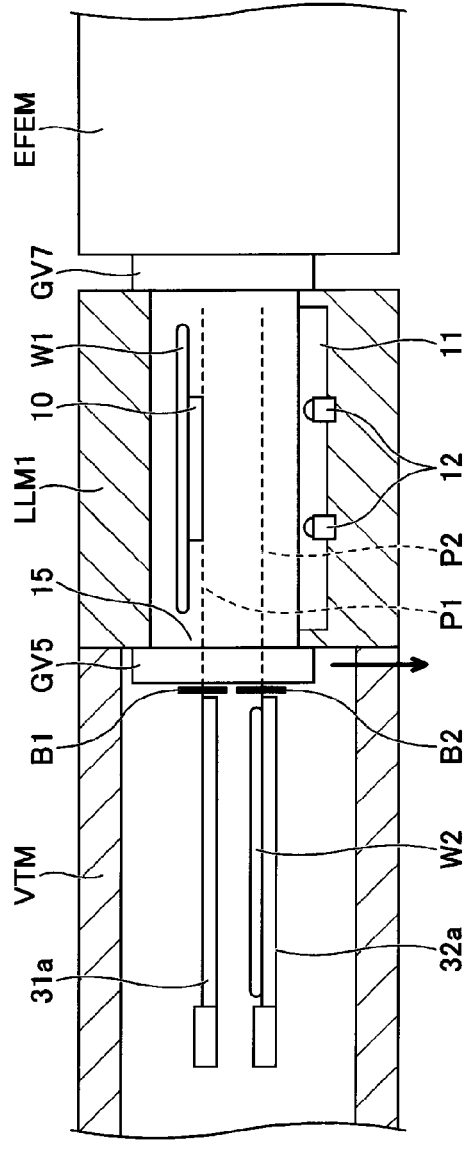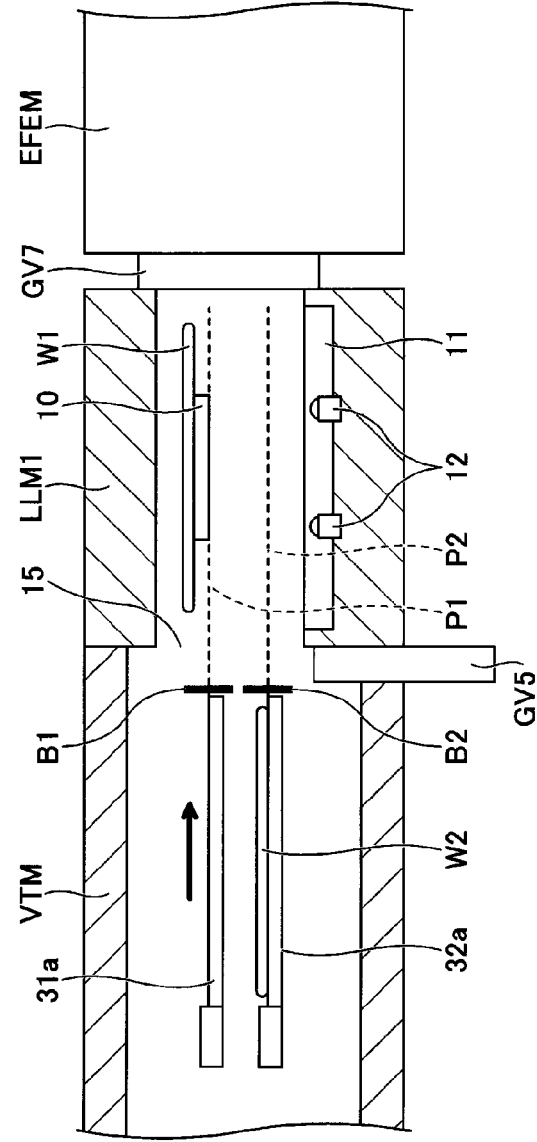
FIG. 4A
FIG. 4B

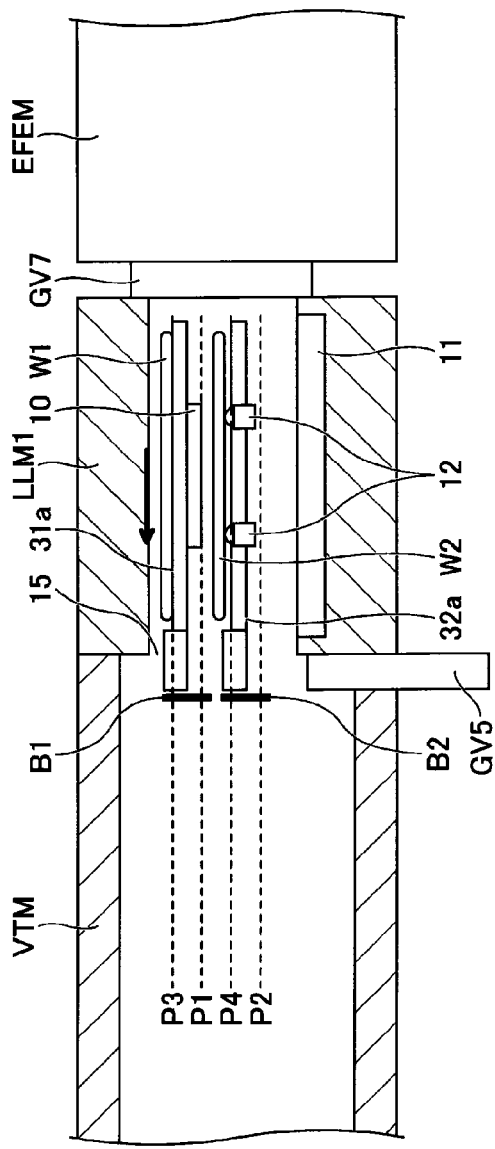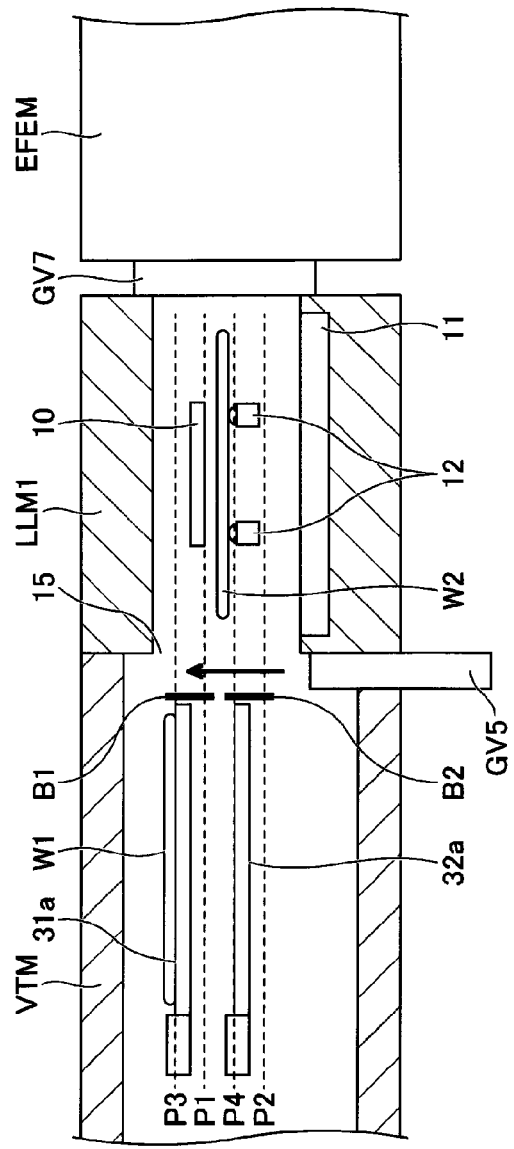
FIG. 6A
FIG. 6B

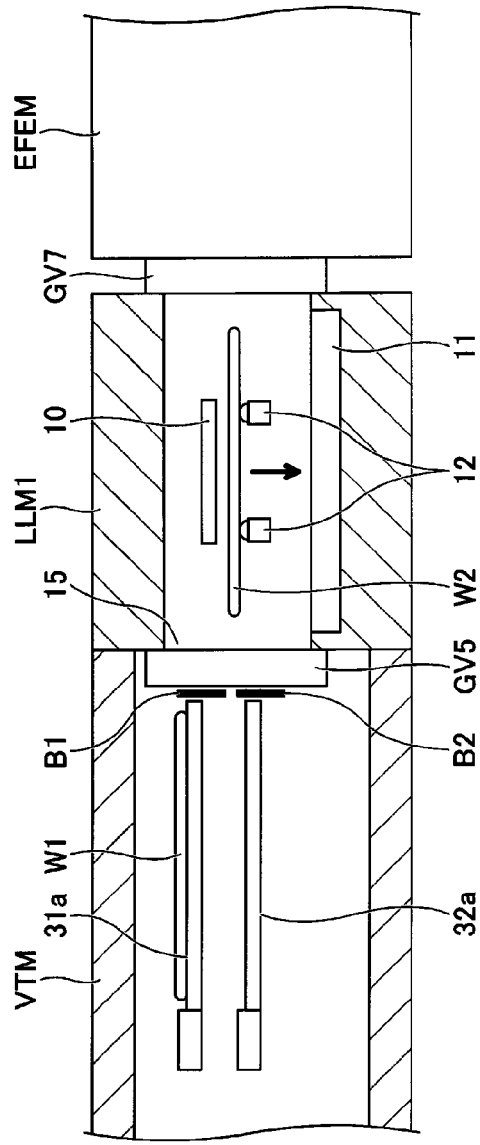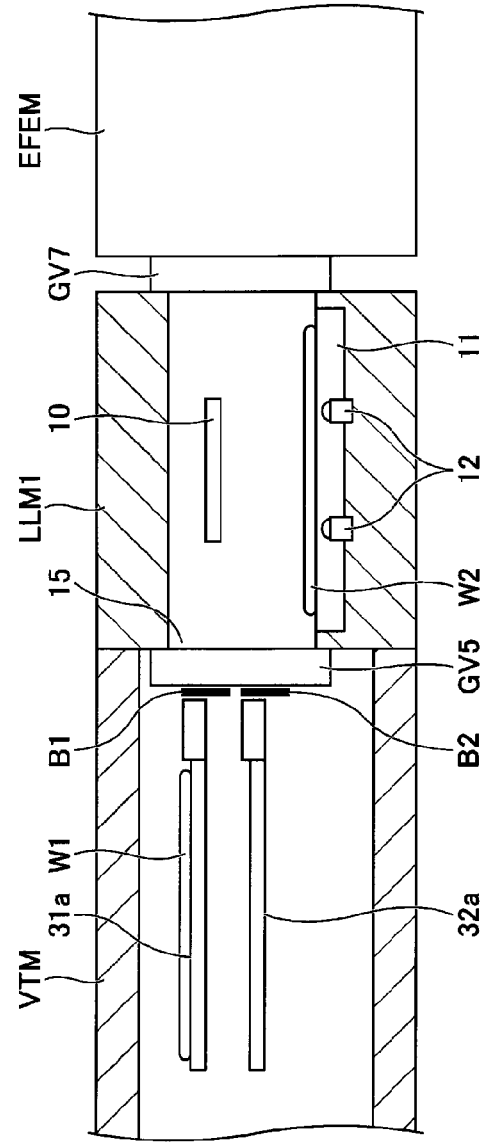

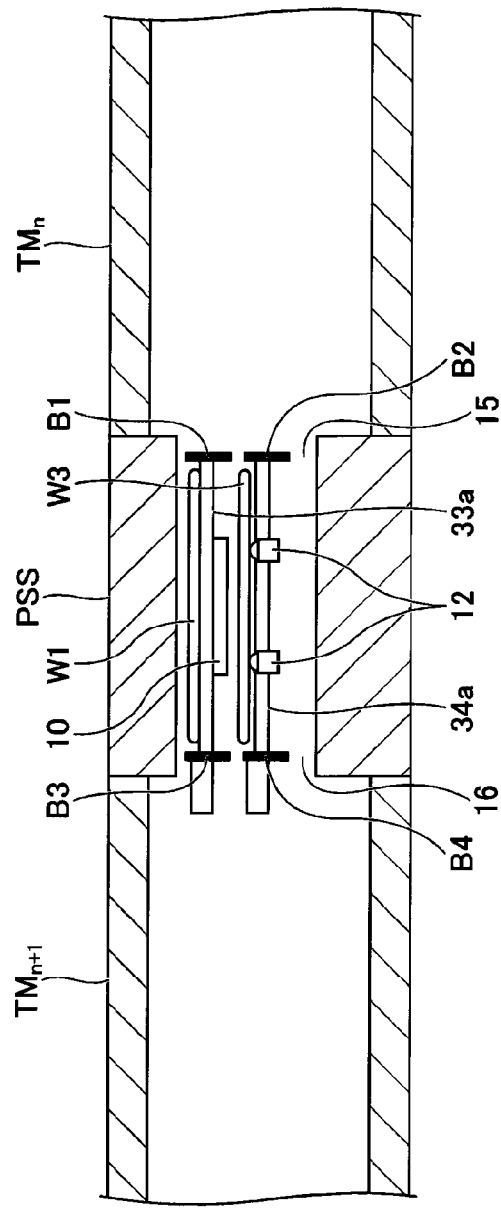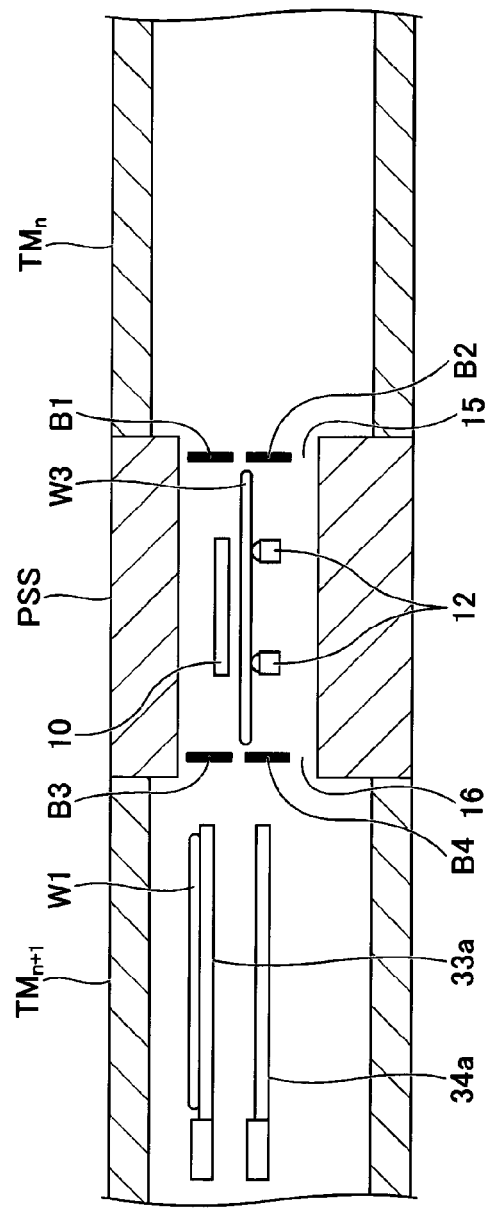
FIG. 24A
FIG. 24B

TRANSFER DETECTION METHOD AND SUBSTRATE PROCESSING APPARATUS

This is a National Phase Application filed under 35 U.S.C. 371 as a national stage of PCT/JP2019/045242, filed Nov. 19, 2019, an application claiming the benefit of Japanese Application No. 2018-226866, filed Dec. 3, 2018, the content of each of which is hereby incorporated by reference in its entirety.

TECHNICAL FIELD

The present disclosure relates to a transfer detection method and a substrate processing apparatus.

BACKGROUND

A technique of detecting presence or absence of a substrate held on a fork of a transfer robot in a substrate processing apparatus is known. For example, Patent Document 1 proposes providing a sensor for detecting passage of a wafer on both sides of a loading and unloading port and above the loading and unloading port via which the wafer is transferred between a processing chamber and a vacuum transfer chamber. The sensor projects a light beam perpendicular to a transfer surface along which a substrate held on the fork is transferred, and monitor presence or absence of a wafer based on blocking of the light beam.

PRIOR ART DOCUMENT

Patent Document
Patent Document 1: Japanese Laid-Open Patent Publication No. 2017-100261

SUMMARY

The present disclosure provides a transfer detection method of detecting a transfer state in a substrate processing apparatus in which a plurality of substrates is transferred to a plurality of stages.

An aspect of the present disclosure provides a transfer detection method for use in a substrate processing apparatus including a transfer arm, which has a plurality of substrate holders and is configured to transfer a plurality of substrates to a plurality of stages between a first chamber and a second chamber adjacent to the first chamber by using the plurality of substrate holders, and an optical sensor provided in a vicinity of an opening via which the first and second chambers are in communication with each other, the method including: projecting a light beam having a horizontal optical axis parallel to the opening to a position through which the substrates held by the plurality of substrate holders pass; and determining at least one of a state of the substrates on the substrate holders and a state of the transfer arm, in response to a detection result of the light beam projected from the optical sensor.

According to the aspect, it is possible to accurately detect a transfer state in a substrate processing apparatus in which a plurality of substrates is transferred to a plurality of stages.

BRIEF DESCRIPTION OF DRAWINGS

FIGS. 4A and 4B are views illustrating an example of loading and unloading of a wafer according to a first embodiment.

FIGS. 6A and 6B are views illustrating an example of loading and unloading of a wafer according to the first embodiment (continuation of FIGS. 5A and 5B).

FIGS. 7A and 7B are views illustrating an example of loading and unloading of a wafer according to the first embodiment (continuation of FIGS. 6A and 6B).

FIGS. 24A and 24B are views illustrating an example of loading and unloading of a wafer according to the second embodiment (continuation of FIGS. 23A and 23B).

DETAILED DESCRIPTION

Figure 1:
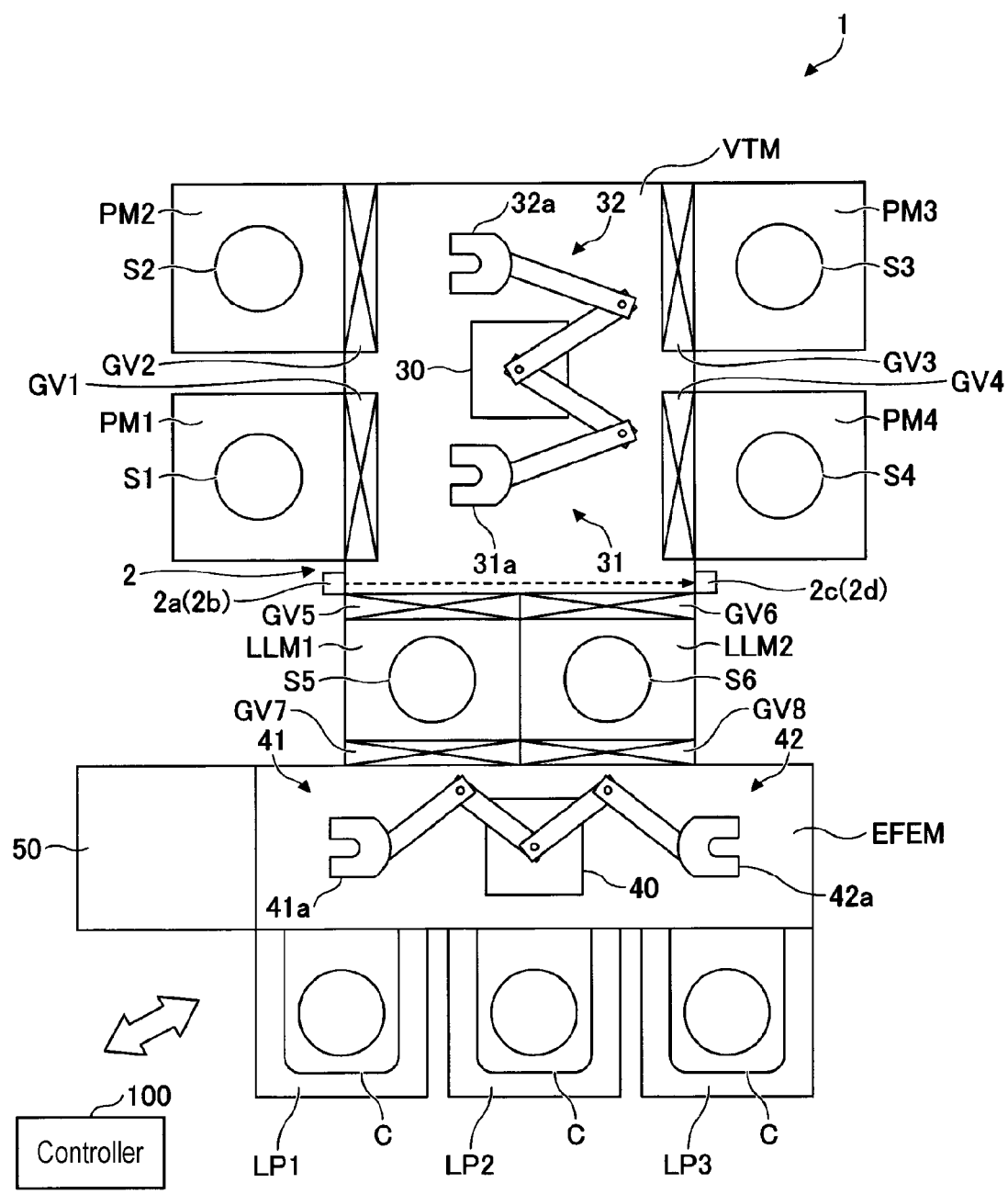
FIG. 1 is a view illustrating an exemplary substrate processing apparatus according to an embodiment.

Hereinafter, embodiments of the present disclosure will be described with reference to the accompanying drawings.

In each of the drawings, the same components are denoted by the same reference numerals, and redundant descriptions may be omitted.

[Substrate-Processing Apparatus]

First, an exemplary substrate processing apparatus 1 according to an embodiment will be described with reference to FIG. 1. FIG. 1 is a top plan view illustrating an exemplary substrate processing apparatus 1 according to an embodiment. The substrate processing apparatus 1 is a system having a cluster structure (multi-chamber type). The substrate processing apparatus 1 includes vacuum processing chambers (process modules) PM1 to PM4, a vacuum transfer chamber (vacuum transfer module) VTM, and load-lock chambers (load lock modules) LLM1 and LLM2. In addition, the substrate processing apparatus 1 has an equipment front end module (EFEM), load ports LP1 to LP3, and a controller 100.

The vacuum processing chambers PM1 to PM4 are depressurized to a predetermined vacuum atmosphere, and inside the vacuum processing chambers PM1 to PM4, a desired process (e.g., an etching process, a film forming process, a cleaning process, or an ashing process) is performed on a semiconductor wafer W (hereinafter, also referred to as "wafer W"). The wafer W is an example of a substrate processed in the vacuum processing chambers PM1 to PM4.

The vacuum processing chambers PM1 to PM4 are disposed adjacent to the vacuum transfer chamber VTM. The vacuum processing chambers PM1 and PM2 are arranged side by side, and the vacuum processing chambers PM3 and PM4 are arranged side by side. Transfer of the wafer W among the vacuum processing chambers PM1 to PM4 and the vacuum transfer chamber VTM is performed via respective loading and unloading ports (see a loading and unloading port 15 in FIGS. 4A and 4B) by opening and closing gate valves GV1 to GV4. The vacuum processing chambers PM1 to PM4 have stages S1 to S4 for placing the wafer W thereon, respectively. Operations of respective components for performing processes in the vacuum processing chambers PM1 to PM4 are controlled by the controller 100. Although the substrate processing apparatus 1 has been described as having four vacuum processing chambers PM1 to PM4, the number of vacuum processing chambers PM is not limited thereto, and may be one or more.

The vacuum transfer chamber VTM is depressurized to a predetermined vacuum atmosphere. In addition, a transfer device 30 for transferring the wafer W is provided inside the vacuum transfer chamber VTM. The transfer device 30 performs loading and unloading of the wafer W among the vacuum processing chambers PM1 to PM4 and the vacuum transfer chamber VTM according to the opening and closing of the gate valves GV1 to GV4. The transfer device 30 also performs loading and unloading of the wafer W among the load-lock chambers LLM1 to LLM2 and the vacuum transfer chamber VTM according to opening and closing of gate valves GV5 and GV6. Operations of the transfer device 30 and the opening and closing of the gate valves GV1 to GV6 are controlled by the controller 100.

The transfer device 30 has a first transfer arm 31 and a second transfer arm 32. The first transfer arm 31 is configured as an articulated arm, and holds the wafer W by a fork 31a attached to a tip end of the articulated arm. Similarly, the second transfer arm 32 is configured as an articulated arm, and holds the wafer W by a fork 32a attached to a tip end of the articulated arm. The transfer device 30 is not limited to have two forks 31a and 32a, and may have one fork or three or more forks.

The load-lock chambers LLM1 and LLM2 are provided between the vacuum transfer chamber VTM of the vacuum atmosphere and the EFEM of atmospheric atmosphere. The load-lock chambers LLM1 and LLM2 have a function of switching between atmospheric atmosphere and the vacuum atmosphere. The load-lock chambers LLM1 and LLM2 are brought into communication with the vacuum transfer chamber VTM by opening the gate valves GV5 and GV6, respectively. The load-lock chambers LLM1 and LLM2 are brought into communication with the EFEM by opening gate valves GV7 and GV8, respectively. The load-lock chambers LLM1 and LLM2 have stages S5 and S6 on for placing the wafer W thereon, respectively. Switching between the vacuum atmosphere and atmospheric atmosphere in each of the load-lock chambers LLM1 and LLM2 is controlled by the controller 100. The substrate processing apparatus 1 has been described as having two load-lock chambers LLM1 and LLM2, but the present disclosure is not limited thereto. The number of load-lock chambers LLM is not limited thereto.

An optical sensor 2 is installed on outer side walls of the vacuum transfer chamber VTM and in the vicinity of the load-lock chamber LLM1 and the load-lock chamber LLM2. The optical sensor 2 may be a fiber sensor, a laser sensor, or another optical sensor. The optical sensor 2 has a light projector 2a, a light projector 2b, a light receiver 2c, and a light receiver 2d. On one outer side wall of the vacuum transfer chamber VTM, the light projectors 2a and 2b are separately installed in an upper stage and a lower stage. On the other outer side wall corresponding to installation positions (heights) of the light projectors 2a and 2b, the light receivers 2c and 2d are separately installed in an upper stage and a lower stage. As a result, a light beam having an optical axis in a horizontal direction and projected from the light projector 2a is received by the light receiver 2c, and a light beam having an optical axis in the horizontal direction and projected from the light projector 2b is received by the light receiver 2d. The light receiver 2c and the light receiver 2d detect whether or not the light beams are blocked by a wafer W based on amounts of received light. Thus, it possible to determine presence or absence of a wafer W on a fork.

The EFEM is, for example, an atmospheric pressure transfer chamber in which downflow of clean air is formed. The EFEM is provided with an alignment device 50 configured to align a position of the wafer W and a transfer device 40 configured to transfer the wafer W. The transfer device 40 performs loading and unloading of the wafer W among the load-lock chambers LLM1 and LLM2 and the EFEM according to the opening and closing of the gate valves GV7 and GV8. The transfer device 40 also performs loading and unloading of the wafer W with respect to the alignment device 50. Operations of the transfer device 40, operations of the alignment device 50, and the opening and closing of the gate valves GV7 and GV8 are controlled by the controller 100.

The transfer device 40 has a transfer arm 41 and a transfer arm 42. The transfer arm 41 is configured as an articulated arm, and holds the wafer W by a fork 41a attached to a tip end of the articulated arm. Similarly, the transfer arm 42 is configured as an articulated arm, and holds the wafer W by a fork 42a attached to the tip end of the articulated arm. Although the transfer device 40 has been described as having two forks 41a and 42a, the forks 41a and 42a are examples of a plurality of substrate holders, and the present disclosure is not limited thereto. The number of substrate holders may be one, or three or more. The optical sensor 2 may be installed in the vicinity of contact surfaces between the EFEM and the load-lock chamber LLM1 and the load-lock chamber LLM2. Further, the transfer arm is not limited to two transfer arms, i.e., the transfer arm 41 and the transfer arm 42, and may be configured by, for example, one transfer arm having two substrate holders.

The alignment device 50 detects positions of notches, alignment marks, or the like provided on the wafer W to so as detect misalignment of the wafer W. The alignment device 50 aligns the position of the wafer W based on the detected positional deviation of the wafer W.

The load ports LP1 to LP3 are provided on a wall surface of the EFEM. A carrier C accommodating wafers W or an empty carrier C is mounted on each of the load ports LP1 to LP3. As the carrier C, for example, front opening unified pods (FOUPs) may be used.

The transfer device 40 holds wafers W accommodated in the carriers C of the load ports LP1 to LP3 by using the forks 41a and 42a, and takes the wafers W out of the carriers C. In addition, the transfer device 40 accommodates wafers W held by the forks 41a and 42a in the carriers C of the load ports LP1 to LP3. Although the substrate processing apparatus 1 has been described as having three load ports LP1 to LP3, the number of load ports LP is not limited thereto.

The controller 100 has a central processing unit (CPU), a read only memory (ROM), a random access memory (RAM), and a hard disk drive (HDD). The controller 100 may have a storage, such as a solid-state drive (SSD), other than the HDD. A recipe in which process procedures, process conditions, and transfer conditions are set is stored in the storage such as the HDD, the RAM, or the like.

The CPU controls processes for wafers W in the respective vacuum processing chambers PM1 to PM4 according to the recipe, and controls transfer of the wafers W. The HDD or RAM may store a program for executing the processes for the wafers W in the respective vacuum processing chambers PM1 to PM4 and the transfer of the wafers W. The program may be stored in a storage medium and provided, or may be provided from an external device via a network.

[Optical Sensor]

Next, an arrangement of an optical sensor for detecting a wafer W transferred in the substrate processing apparatus 1 according to the embodiment will be described with reference to FIGS. 2A and 2B in comparison with a comparative example.

Figure 2A:
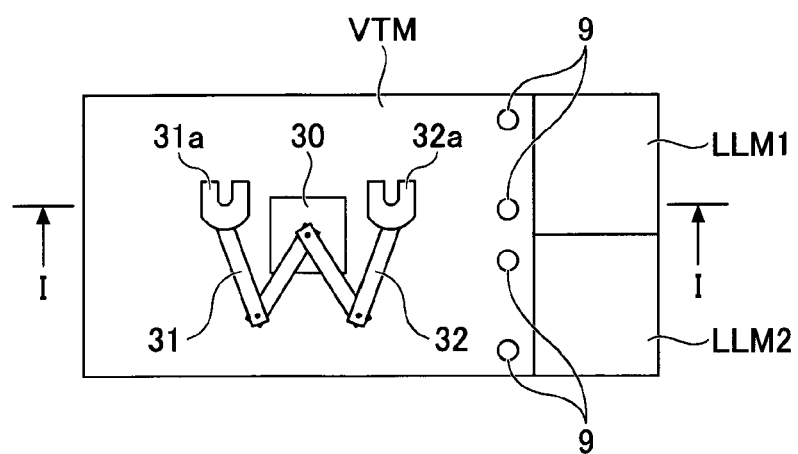
FIGS. 2A and 2B are views illustrating an arrangement of a sensor according to a comparative example.
Figure 2B:
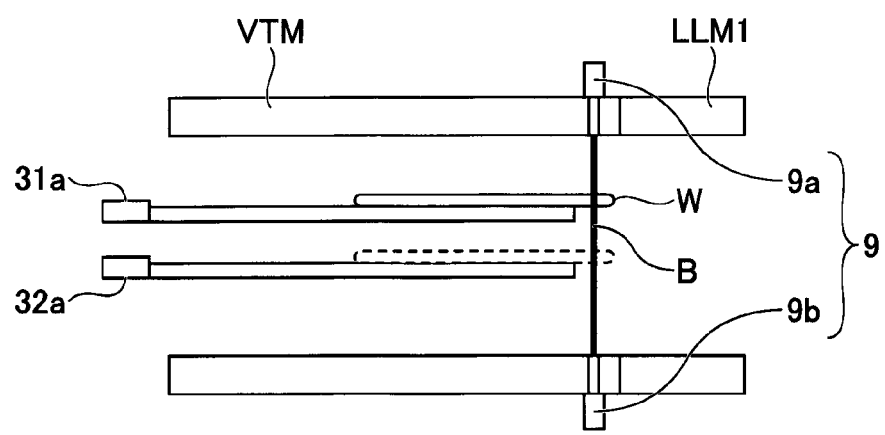
Figure 3A:
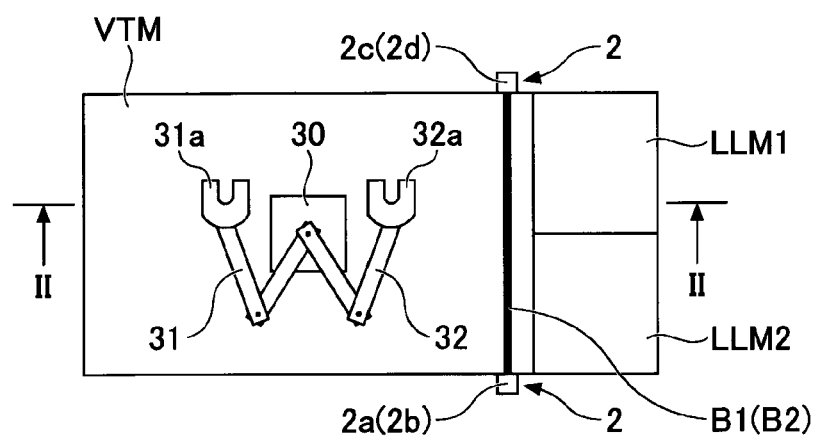
FIGS. 3A and 3B are views illustrating an arrangement of a sensor according to an embodiment.
Figure 3B:
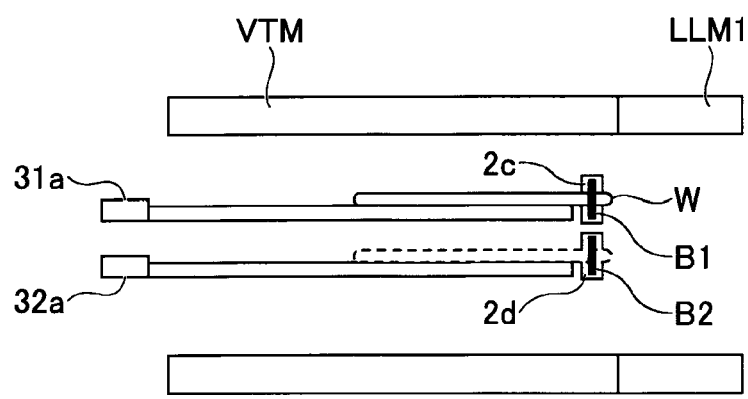

FIG. 2A is an arrangement example of an optical sensor 9 according to a comparative example FIG. 2B is a cross section taken along line I-I of FIG. 2A, illustrating a view in which the forks 31a and 32a are directed toward the load-lock chambers LLM1 and LLM2. FIG. 3A is an arrangement example of the optical sensor 2 according to the embodiment. FIG. 3B is a cross section taken along line II-II of FIG. 3A, illustrating a view in which the forks 31a and 32a are directed toward the load-lock chambers LLM1 and LLM2.

In the comparative example of FIGS. 2A and 2B, the optical sensor 9 is provided in the vicinity of the loading and unloading port 15 (see the loading and unloading port 15 in FIGS. 4A and 4B) via which a wafer W is transferred between the load-lock chambers LLM1 and LLM2 and the vacuum transfer chamber VTM. The optical sensor 9 forms a light beam B having an optical axis in a direction perpendicular to a direction from the light projector 9a above the loading and unloading port 15 to the light receiver 9b below the loading and unloading port 15. Passage of the wafer W is detected based on an amount of light received by the light receiver 9b. The fork 31a holding the wafer W and the fork 32a not holding the wafer W are waiting in the vacuum transfer chamber VTM. When the forks 31a and 32a enter the load-lock chamber LLM1, the light beam B formed by the optical sensor 9 is blocked. Therefore, presence or absence of the wafer W is determined based on the amount of light received by the light receiver 9b. The loading and unloading port 15 is an example of an opening via which the load-lock chamber LLM1 and the load-lock chamber LLM2 are brought into communication with the vacuum transfer chamber VTM.

However, in the case of the comparative example, as illustrated in FIG. 2B, when the wafer W is transferred in a state where the fork 31a in the upper stage and the fork 32a in the lower stage are overlapped in a plan view, it cannot be determined which of the fork 31a in the upper stage and the fork 32a in the lower stage holds and transfers the wafer W.

Therefore, in the present embodiment, as illustrated in FIGS. 3A and 3B, two light beams B1 and B2 having optical axes in the horizontal direction are formed in the vicinity of the loading and unloading port 15 between the load-lock chambers LLM1 and LLM2 and the vacuum transfer chamber VTM.

The optical sensor 2 is installed on the outer side walls of the vacuum transfer chamber VTM in the vicinity of the loading and unloading port 15. On one side wall of the vacuum transfer chamber VTM, two light projectors 2a and 2b are separately installed in the upper and lower stages. On the other side wall of the vacuum transfer chamber VTM, two light receivers 2c and 2d are separately installed in upper and lower stages at substantially the same heights as those of the light projectors 2a and 2b.

As a result, the light beams B1 and B2 having the horizontal optical axes parallel to the loading and unloading port 15 are formed at positions where wafers W held by the two forks 31a and the fork 32a pass. In FIG. 3B, the two light beams B1 and B2, which have the horizontal optical axes and are projected from the light projector 2a and the light projector 2b, are formed in the upper and lower stages, whereby the light beam B1 is received by the light receiver 2c and the light beam B2 is received by the light receiver 2d.

According to this, as illustrated in FIG. 3B, the light beams B1 and B2 having the optical axes horizontal with respect to a transfer surface are formed correspondingly to the number of the two forks 31a and 32a. Thus, it possible to determine which of the fork 31a and the fork 32a holds a wafer W. Specifically, when an amount of light received by the light receiver 2c is equal to or less than a predetermined threshold value (a first threshold value), the controller 100 determines that the wafer W is held by the fork 31a in the upper stage. On the contrary, when an amount of light received by the light receiver 2d is equal to or less than the first threshold value, the controller 100 determines that the wafer W is held by the fork 32a in the lower stage. The first threshold value is preset to an amount of light received by the light receiver 2c when the wafer W is placed on the fork. Thus, it possible to accurately detect a wafer transfer state in the substrate processing apparatus 1 in which a plurality of wafers is transferred to a plurality of stages.

In addition, a light beam having an optical axis in the horizontal direction enters the vacuum transfer chamber VTM via a window provided on a side wall of the vacuum transfer chamber VTM while maintaining a vacuum state in the vacuum transfer chamber VTM, and is emitted from the opposite side wall of the chamber VTM. In FIGS. 3A and 3B, the optical sensor 2 is installed at the vacuum transfer chamber VTM in the vicinity of the loading and unloading port 15, but the present disclosure is not limited thereto. Optical sensors may be installed at the load-lock chamber LLM1 and the load-lock chamber LLM2 in the vicinity of the loading and unloading port 15. However, it is desirable to install the optical sensor 2 at the vacuum transfer chamber VTM rather than to install the optical sensor 2 at each of the load-lock chamber LLM1 and the load-lock chamber LLM2, because the number of optical sensors 2 can be reduced.

First Embodiment

[Example of Loading and Unloading of Wafer]

Next, an example of loading and unloading of a wafer according to a first embodiment will be described with reference to FIGS. 4A to 7B. FIGS. 4A to 7B are views illustrating an example of loading and unloading of a wafer according to the first embodiment. In FIGS. 4A to 7B, detecting loading and unloading of a wafer W between the vacuum transfer chamber VTM and the load-lock chamber LLM1 will be described by way of example. However, detection of a wafer W is not limited thereto, and may include a case of detecting loading and unloading of a wafer W between the vacuum transfer chamber VTM and the load-lock chamber LLM2, and a case of detecting loading and unloading of a wafer W between the vacuum transfer chamber VTM and the processing chambers PM1 to PM4. The detection of a wafer W may further include a case of detecting loading and unloading of a wafer W between the EFEM and the load-lock chamber LLM1 and/or between the EFEM and the load-lock chamber LLM2, and a case of detecting loading and unloading of a wafer W between the load port LP and the EFEM.

FIGS. 4A to 7B illustrate the light beam B1 horizontally projected from the light projector 2a of the optical sensor 2 and the light beam B2 projected from the light projector 2b, but do not illustrate the light projector 2a, the light projector 2b, the light receiver 2c receiving the light beam B1, and the light receiver 2d receiving the light beam B2.

In an initial state illustrated in FIG. 4A the gate valve GV5 between the vacuum transfer chamber VTM and the load-lock chamber LLM1 is closed, thereby keeping airtightness of the load-lock chamber LLM1. In this state, the load-lock chamber LLM1 is evacuated to change the inside thereof from atmospheric atmosphere to a vacuum atmosphere. In the example of FIG. 4A, a wafer W1 is placed on a stage 10 in the upper stage of the load-lock chamber LLM1.

The fork 32a is in a state of holding a wafer W2, and the fork 31a is in a state of not holding a wafer and waiting in the vicinity of the gate valve GV5. In FIGS. 4A to 6B, P1 indicates a transfer surface of the fork 31a when a wafer is loaded into the load-lock chamber LLM1, and P2 indicates a transfer surface of the fork 32a when a wafer is loaded into the load-lock chamber LLM1. In addition, in FIGS. 5A to 6B, P3 indicates a transfer surface of the fork 31a when a wafer is unloaded from the load-lock chamber LLM1, and P4 indicates a transfer surface of the fork 32a when a wafer is unloaded from the load-lock chamber LLM1.

The light beam B1 is a light beam having the horizontal optical axis parallel to the loading and unloading port 15, and is projected to a position through which the wafer W held on the transfer surface P1 or P3 and the fork 31a pass. The light beam B2 is a light beam having the horizontal optical axis parallel to the loading and unloading port 15, and is projected to a position through which the wafer W held on the transfer surface P2 or P4 and the fork 32a pass.

Subsequently, as illustrated in FIG. 4B, the gate valve GV5 is opened. As a result, the vacuum transfer chamber VTM and the load-lock chamber LLM1 are brought into communication with each other via the loading and unloading port 15.

Figure 5A:
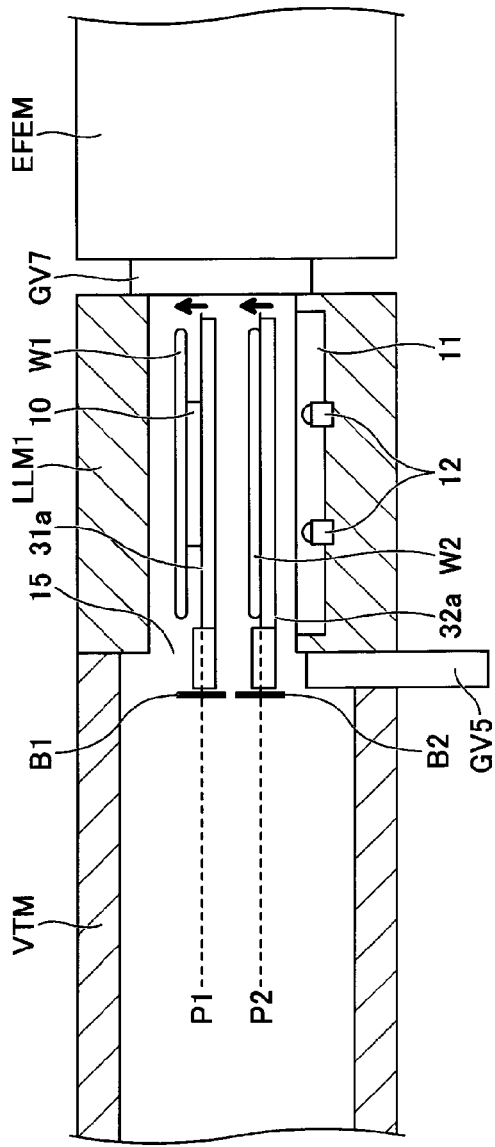
FIGS. 5A and 5B are views is a view illustrating an example of loading and unloading of a wafer according to the first embodiment (continuation of FIGS. 4A and 4B).

Subsequently, as illustrated in FIG. 5A, the fork 31a and the fork 32a enter the load-lock chamber LLM1 via the loading and unloading port 15. The controller 100 determines whether the wafer W has been loaded into the upper or lower stage of the load-lock chamber LLM1 from the vacuum transfer chamber VTM based on an amount of light detected by the optical sensor 2 or an amount of blocked light.

Figure 5B:
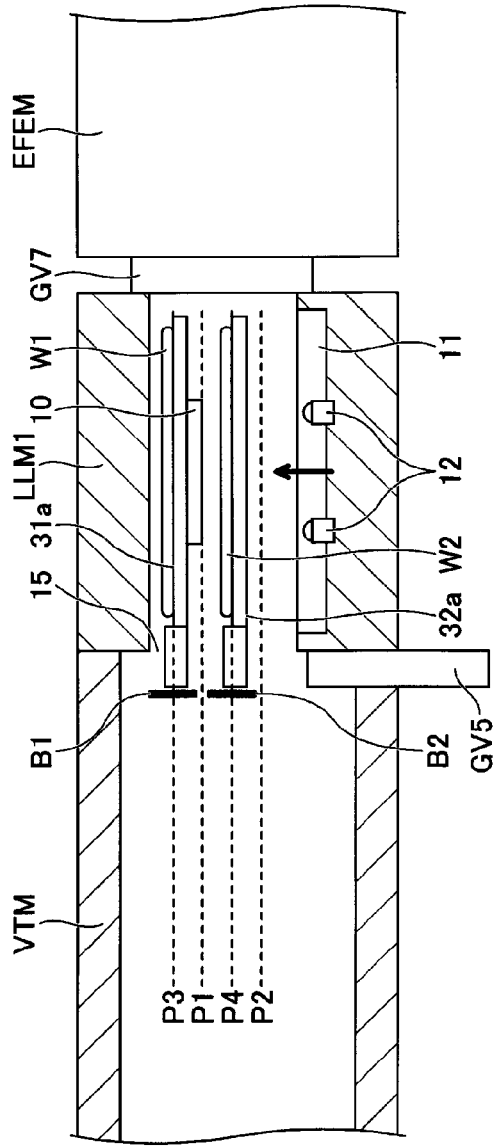

Subsequently, as illustrated in FIG. 5B, the fork 31a and the fork 32a are raised. At this time, while the fork 32a holds the wafer W2, the fork 31a raise the wafer W1 from the stage 10 and holds the wafer W1.

Subsequently, as illustrated in FIG. 6A, lifter pins 12 are moved up, whereby the wafer W2 is raised from the fork 32a and held by the lifter pins 12.

Subsequently, as illustrated in FIG. 6B, the fork 31a and the fork 32a are retracted from the load-lock chamber LLM1 via the loading and unloading port 15. At this time point, the fork 31a is in a state of holding the wafer W1, and the fork 32a is in a state of not holding a wafer because the wafer W2 has been delivered to the lifter pins 12.

At this time, an amount of light L1 of the light beam B1 received by the light receiver 2c in the upper stage is momentarily reduced because the fork 31a and the wafer W1 block the light beam B1. In addition, an amount of light L2 of the light beam B2 received by the light receiver 2d in the lower stage is momentarily reduced because the fork 32a blocks the light beam B2. Therefore, the amount of light L1 is smaller than the amount of light L2 by an amount of light beam B1 blocked by the wafer W1. Therefore, by comparing the amount of light L1 and the amount of light L2 with the first threshold value that allows determination of whether or not a wafer is held, it is possible to determine whether the fork 31a and/or the fork 32a hold a wafer W.

After the fork 31a and the fork 32a are retracted from the load-lock chamber LLM1, the gate valve GV5 is closed as illustrated in FIG. 7A. Subsequently, as illustrated in FIG. 7B, the lifter pins 12 are moved down and the wafer W2 is placed on a stage 11. Thereafter, for example, N2 gas is supplied to the load-lock chamber LLM1 to cool the wafer W2.

[Detection Process]

Figure 8:
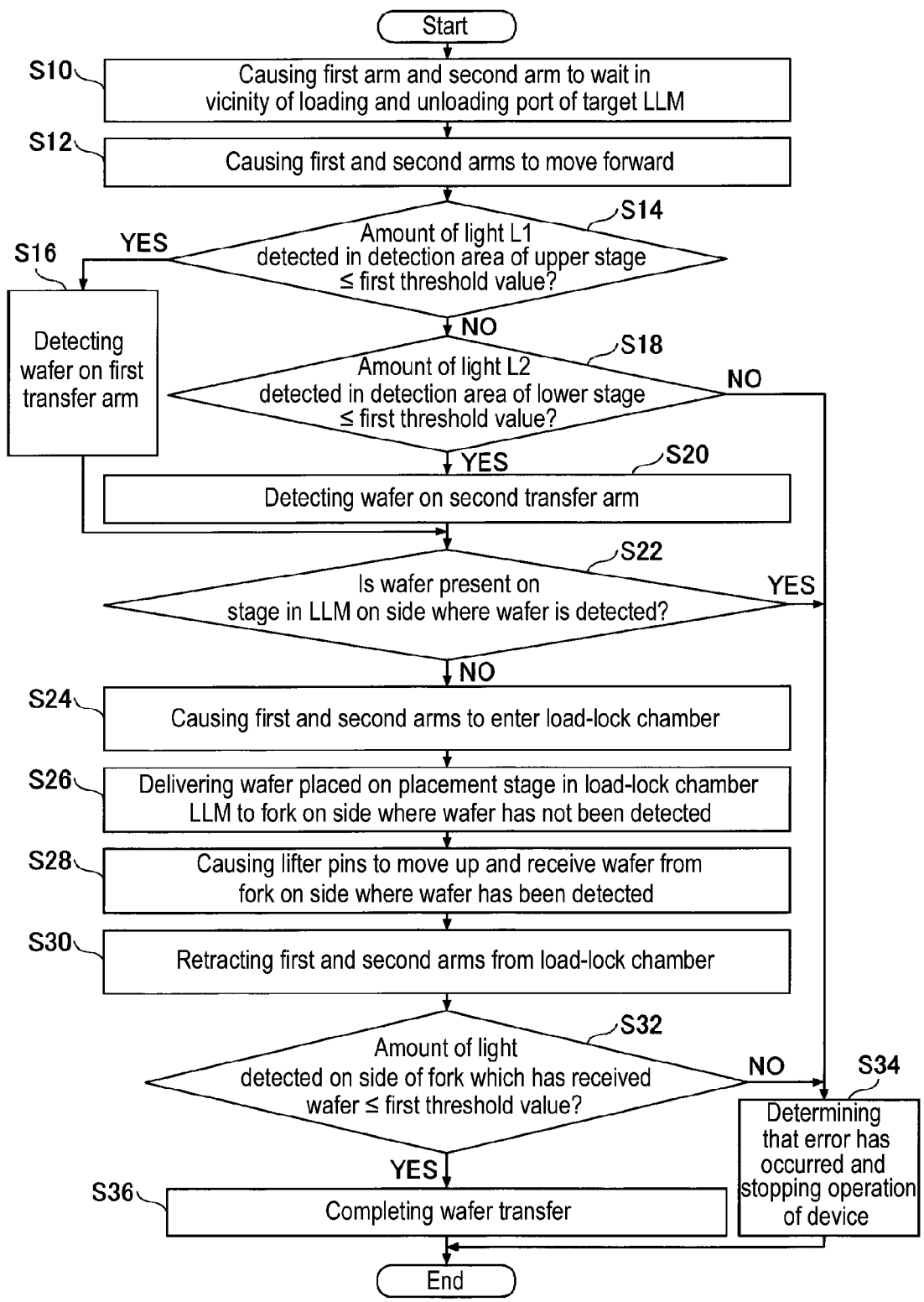
FIG. 8 is a flowchart illustrating an example of a detection process according to the first embodiment.

Next, a detection process during a wafer transfer according to the first embodiment will be described with reference to FIGS. 8 to 18B. FIG. 8 is a flowchart illustrating an example of a detection process during a wafer transfer according to the first embodiment. FIGS. 9A to 18B are views illustrating the detection process according to the first embodiment. Here, the detection process during a transfer of a wafer W from the vacuum transfer chamber VTM to the load-lock chamber LLM1 will be described by way of example. The detection process is controlled by the controller 100.

The light projectors 2a and 2b of the optical sensor 2 are installed on the outer side walls of the vacuum transfer chamber VTM, and the detection process of FIG. 8 is started in a state in which projected light beams are received by the light receivers 2c and 2d via a window provided on the side walls of the vacuum transfer chamber VTM.

The controller 100 causes the fork 31a of the first transfer arm 31 and the fork 32a of the second transfer arm 32 to wait in the vicinity of the loading and unloading port 15 between a target load-lock chamber LLM to which a wafer is transferred and the vacuum transfer chamber VTM (step S10).

Figure 9A:
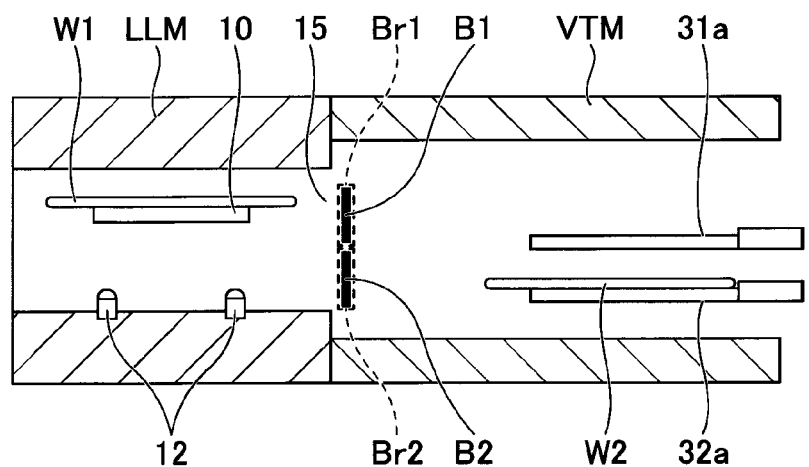
FIGS. 9A and 9B are views for explaining a detection process according to the first embodiment.
Figure 9B:
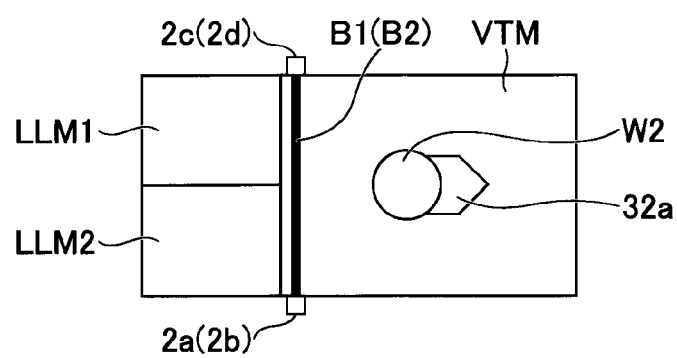

FIGS. 9A and 9B illustrate such an initial state. The vacuum transfer chamber VTM is shown on the right-hand side, and the load-lock chambers LLM1 and LLM2 (LLM1 and LLM2 are also collectively referred to as LLM) are shown on the left-hand side. FIG. 9A is a cross-sectional view illustrating the vacuum transfer chamber VTM and the load-lock chamber LLM, and FIG. 9B is a top view of the vacuum transfer chamber VTM and the load-lock chambers LLM1 and LLM2. The light beams B1 and B2 are projected from the light projector 2a and the light projector 2b of the optical sensor 2, and are received by the light receiver 2c and the light receiver 2d of the optical sensor 2, respectively. As a result, presence or absence of a wafer is detected based on blocking of the light beam B1 and the light beam B2 by a wafer, in a detection region Br1 of the upper stage and a detection region Br2 of the lower stage in the vicinity of the loading and unloading port 15.

Figure 10A:
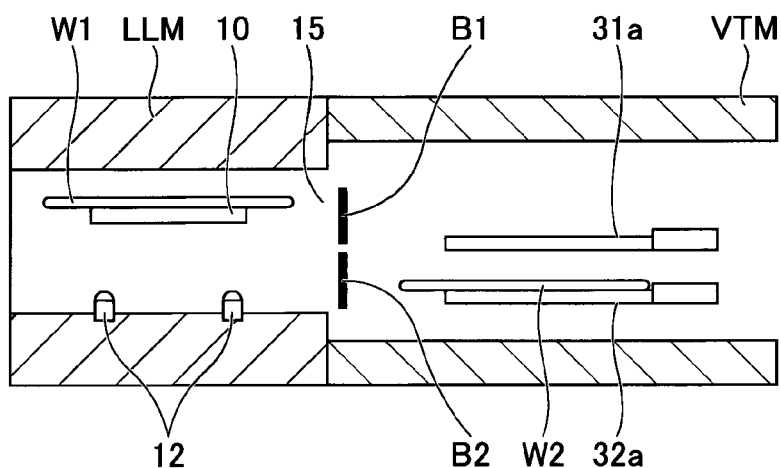
FIGS. 10A and 10B are views illustrating a detection process (continuation of FIGS. 9A and 9B) according to the first embodiment.
Figure 10B:
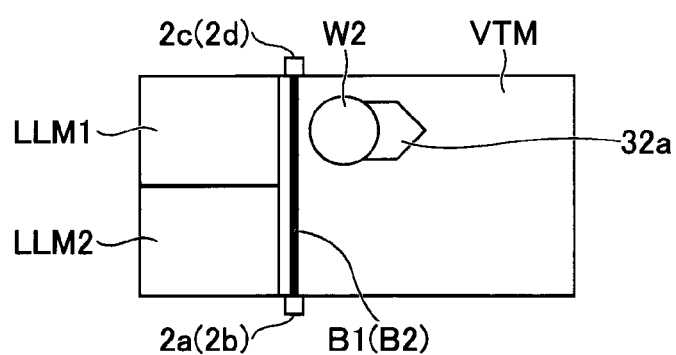
Figure 11A:
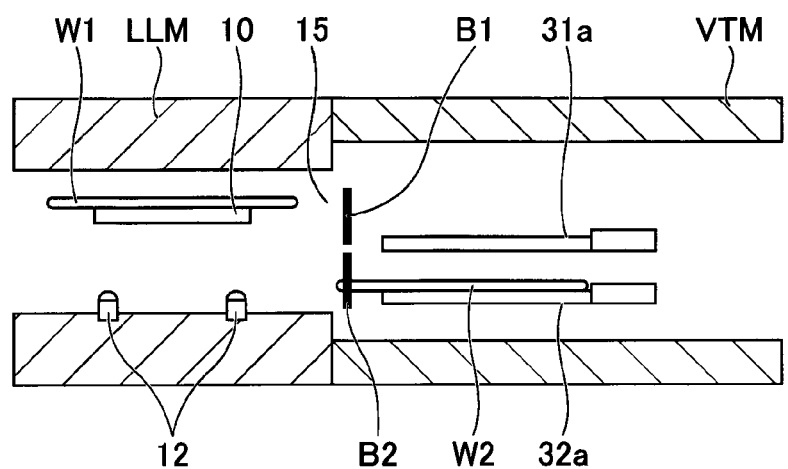
FIGS. 11A and 11B are views illustrating a detection process (continuation of FIGS. 10A and 10B) according to the first embodiment.
Figure 11B:
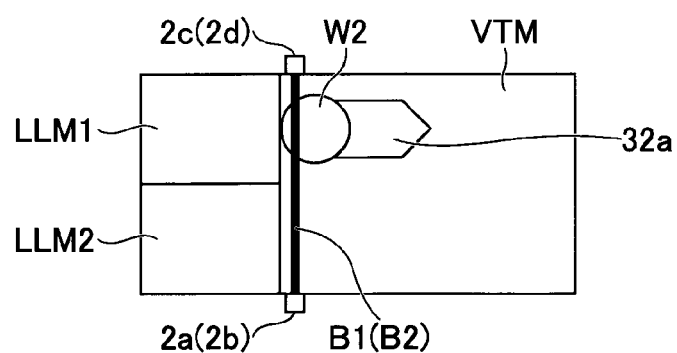
Figure 12A:
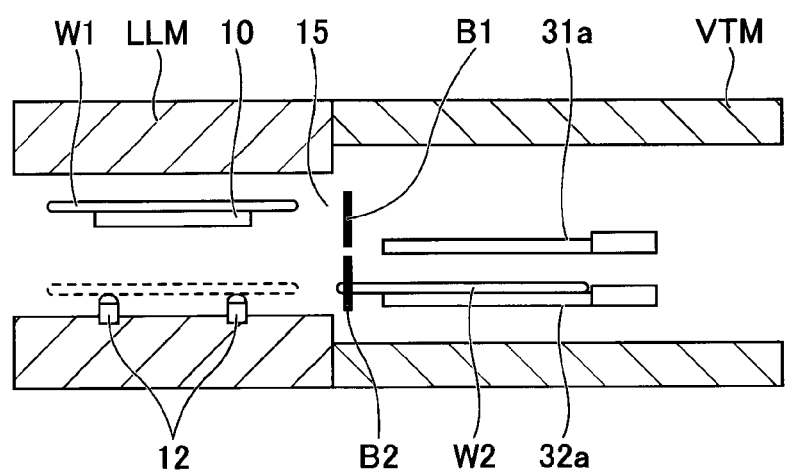
FIGS. 12A and 12B are views illustrating a detection process (continuation of FIGS. 11A and 11B) according to the first embodiment.
Figure 12B:
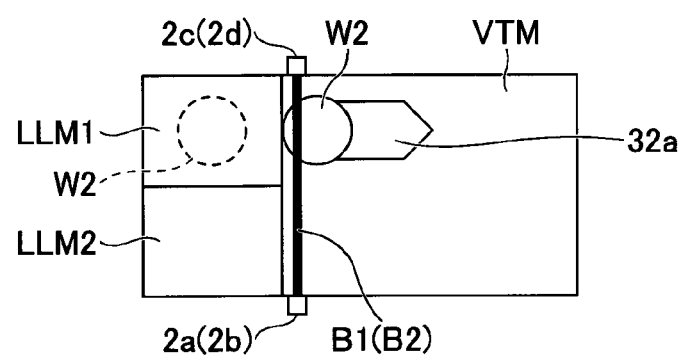

FIGS. 10A and 10B illustrate a state in which the fork 31a and the fork 32a wait in front of the LLM. In this example, the fork 31a does not hold a wafer and the fork 32a holds the wafer W2. In addition, the wafer W1 is placed on the stage 10 in the load-lock chamber LLM. The load-lock chamber LLM1 and the load-lock chamber LLM2 are arranged side by side along the contact surfaces between the load-lock chambers LLM1 and LLM2 and the vacuum transfer chamber VTM. The fork 31a and the fork 32a are arranged in the upper and lower stages so as to overlap each other in a plan view.

Subsequently, in step S12 of FIG. 8, the controller 100 causes the fork 31a of the first transfer arm 31 and the fork 32a of the second transfer arm 32 to move forward. The controller 100 determines whether the amount of light L1 of the light beam B1 received by the light receiver 2c when the fork 31a passes through the detection region Br1 in the upper stage is equal to or less than the first threshold value (step S14).

When the amount of light L1 is determined to be equal to or less than the first threshold value, the controller 100 determines that a wafer is held on the fork 31a of the first transfer arm 31 (step S16), and proceeds to step S22.

In contrast, when the amount of light L1 is determined to be greater than the first threshold value, the controller 100 determines whether the amount of light L2 of the light beam B2 received by the light receiver 2d when the fork 32a passes through the detection region Br2 in the lower stage is equal to or less than the first threshold value (step S18). For example, in the example of FIGS. 11A and 11B, the light beam B1 is not blocked by a wafer, but the light beam B2 is blocked by the wafer W2. Thus, when the forks pass through the detection regions Br1 and Br2, respectively, the amount of light L2 of the light beam B2 becomes less than the amount of light L1 of the light beam B1, and becomes equal to or less than the first threshold value. The amount of light L1 of the light beam B1 is greater than the first threshold value. In this way, the optical sensor 2 can determine whether or not a wafer W is on a fork.

That is, in step S18, when the amount of light L2 is determined to be equal to or less than the first threshold value, the controller 100 determines that a wafer is held on the fork 32a (step S20), and proceeds to step S22. On the contrary, when the amount of light L2 is determined to be greater than the first threshold value in step S18, the controller 100 determines that an error has occurred because no wafer is held on any of the fork 31a and the fork 32a, and stops the wafer transfer by stopping operations of the device (step S34), thereby terminating the process.

Subsequently, in step S22, the controller 100 determines whether or not a wafer is present on the stage in the LLM on the side where the wafer is detected. For example, when a wafer indicated by the dotted line is present on the lifter pins 12 of FIGS. 12A and 12B, the wafer W2 on the fork 32a cannot be loaded into the load-lock chamber LLM1. Therefore, when it is determined that a wafer is present on the stage in the LLM on the side where the wafer is detected, the controller 100 proceeds to step S34 in FIG. 8 and determines that an error has occurred to stop the wafer transfer (step S34), thereby terminating the process.

Figure 13A:
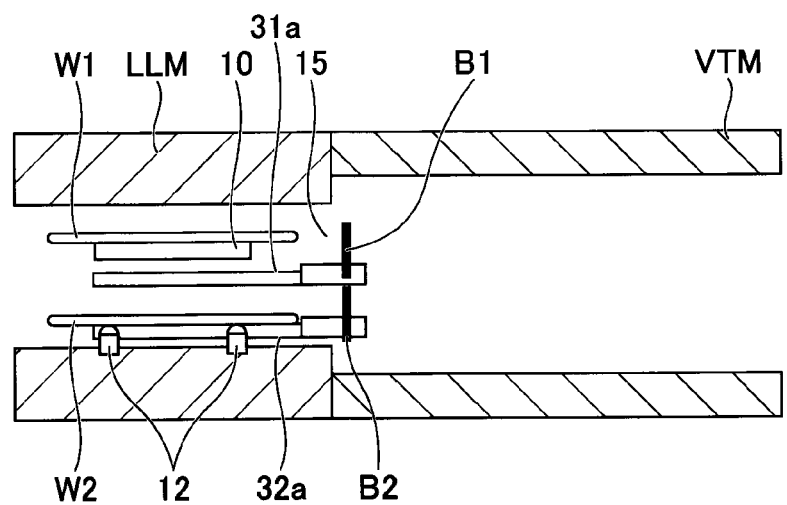
FIGS. 13A and 13B are views illustrating a detection process (continuation of FIGS. 12A and 12B) according to the first embodiment.
Figure 13B:
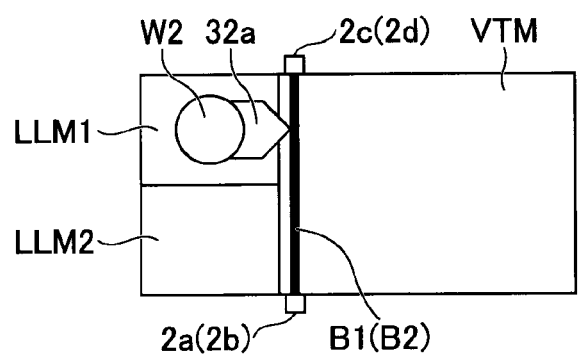

In contrast, in step S22, when it is determined that no wafer is present on the stage in the LLM on the side where the wafer is detected, as shown in FIGS. 13A and 13B, the controller 100 causes the fork 31a of the first transfer arm 31 and the fork 32a of the second transfer arm 32 to enter the load-lock chamber LLM (step S24).

Figure 14A:
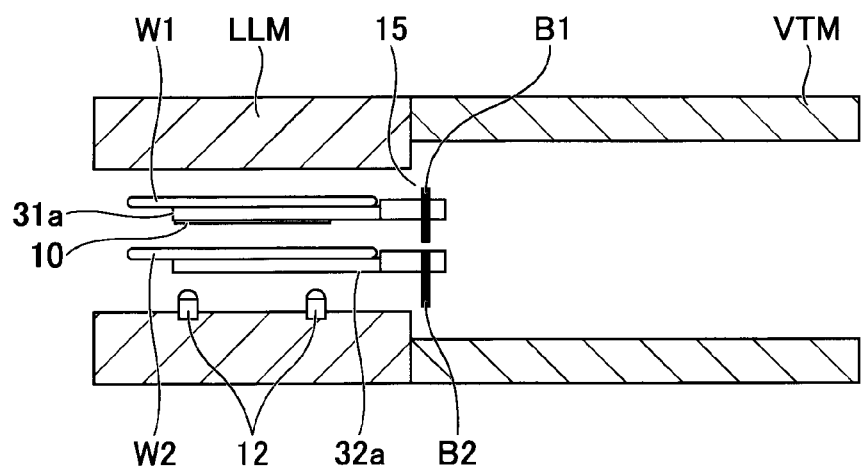
FIGS. 14A and 14B are views illustrating a detection process (continuation of FIGS. 13A and 13B) according to the first embodiment.
Figure 14B:
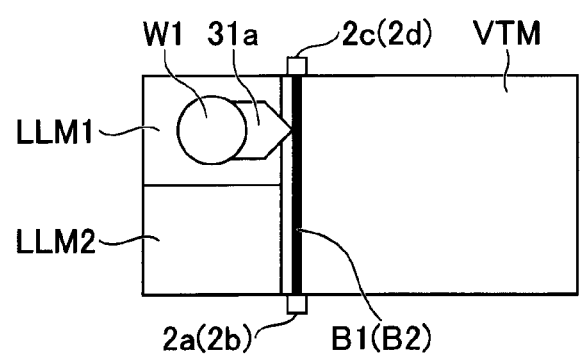

Subsequently, the wafer placed on the stage in the load-lock chamber LLM is delivered to the fork on the side where no wafer is detected (step S26). In FIGS. 14A and 14B, the wafer W1 placed on the stage 10 in the upper stage is delivered to the fork 31a.

Figure 15A:
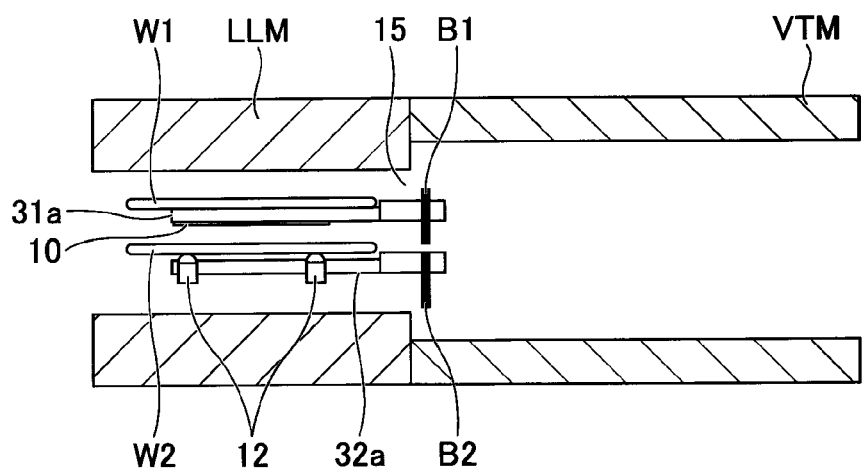
FIGS. 15A and 15B are views illustrating a detection process (continuation of FIGS. 14A and 14B) according to the first embodiment.
Figure 15B:
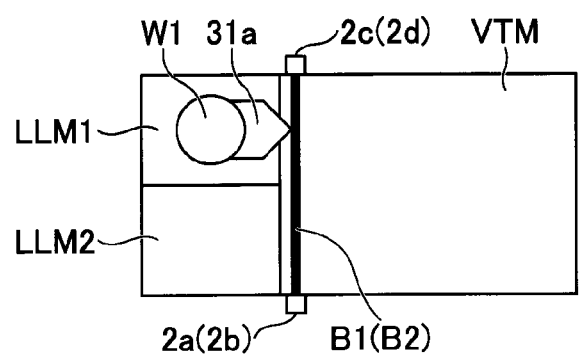

Subsequently, in step S28 of FIG. 8, the controller 100 causes the lifter pins to move up and receive the wafer from the fork on the side where the wafer is detected. In FIGS. 15A and 15B, the lifter pins 12 are raised, and the wafer W2 is delivered from the fork 32a to the lifter pins 12.

Figure 16A:
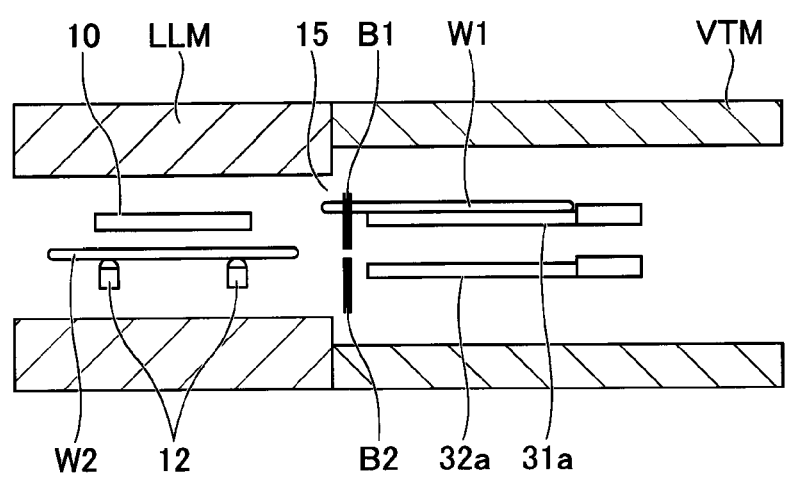
FIGS. 16A and 16B are views illustrating a detection process (continuation of FIGS. 15A and 15B) according to the first embodiment.
Figure 16B:
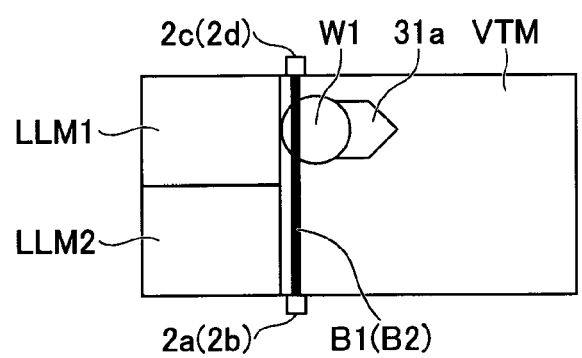
Figure 17A:
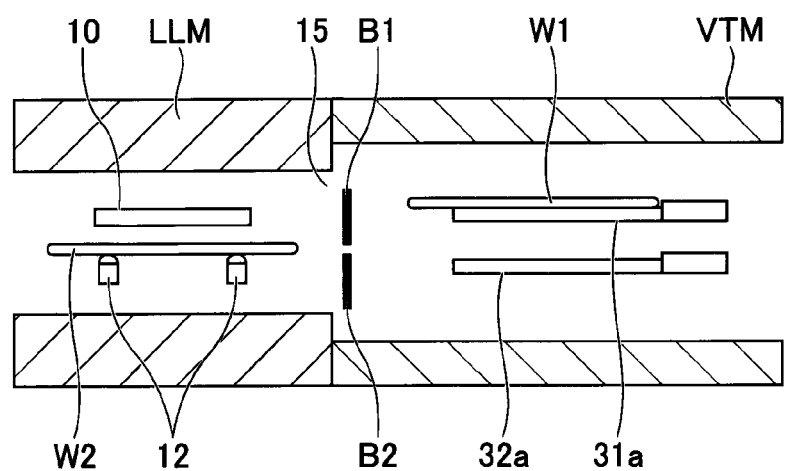
FIGS. 17A and 17B are views illustrating a detection process (continuation of FIGS. 16A and 16B) according to the first embodiment.
Figure 17B:
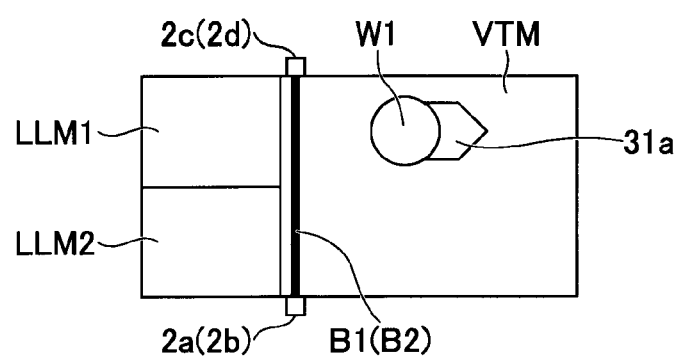

Subsequently, in step S30 of FIG. 8, the controller 100 retracts the first transfer arm 31 and the second transfer arm 32 from the load-lock chamber LLM. Thus, as illustrated in FIGS. 16A and 16B, the wafer W2 is delivered to the lifter pins 12, and the wafer W1 is unloaded to the vacuum transfer chamber VTM in a state of being held on the fork 31a. As a result, as illustrated in FIGS. 17A and 17B, the first transfer arm 31 and the second transfer arm 32 are in a state of being retracted from the load-lock chamber LLM.

Subsequently, in step S32 of FIG. 8, the controller 100 determines whether an amount of light detected in the detection region on the side of the fork, which has received the wafer, is equal to or less than the first threshold value. When the detected amount of light is determined to be greater than the first threshold value, the controller 100 determines that an error has occurred because no wafer is held on the fork which has received the wafer, and stops operations of the device and the wafer transfer (step S34), thereby terminating the process.

Figure 18A:
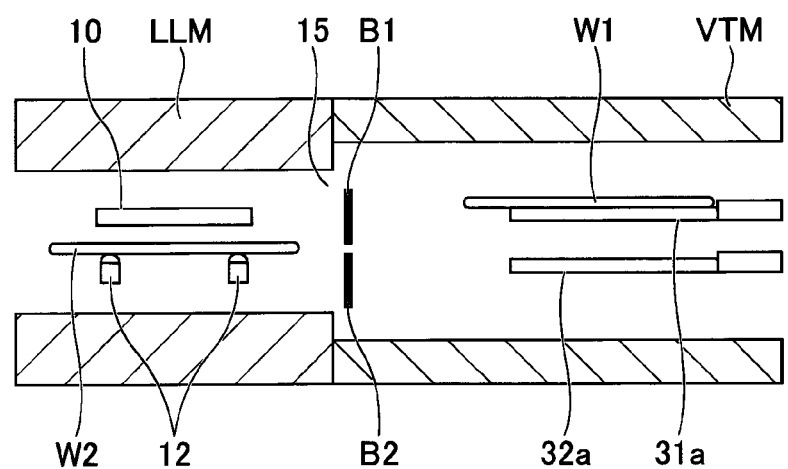
FIGS. 18A and 18B are views illustrating a detection process (continuation of FIGS. 17A and 17B) according to the first embodiment.
Figure 18B:
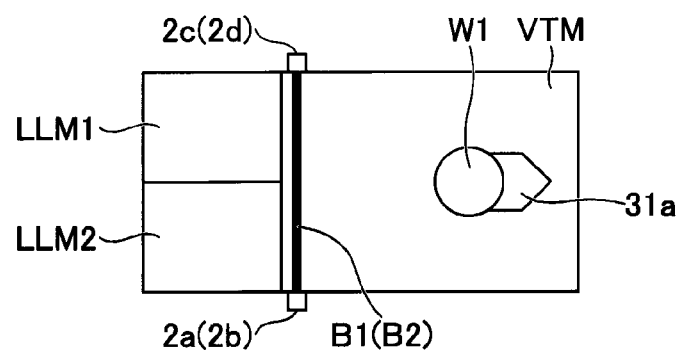

In step S32, when the amount of light detected in the detection region on the side of the fork, which has received the wafer, is determined to be equal to or smaller than the first threshold value, the controller 100 determines that the wafer transfer is completed, and terminates the process. As a result, as illustrated in FIGS. 18A and 18B, the fork 31a and the fork 32a are returned to the positions in the vacuum transfer chamber VTM.

According to the transfer detection method of the present embodiment, it is possible to determine presence or absence of wafers on the fork 31a and the fork 32a based on detection results of the amount of received light by the optical sensor 2. In the present embodiment, it is possible to detect the amounts of light of the two light beams B1 and B2 having the horizontal optical axes, and to separately determine presence or absence of a wafer on the fork 31a and presence or absence of a wafer on the fork 32a based on the detection results. As a result, it is possible to accurately detect the wafer transfer state in the substrate processing apparatus 1 in which a plurality of wafers is transferred to a plurality of stages.

In the foregoing description, as a method of detecting the light blocking state, when the amounts of received light of the two light beams B1 and B2 are equal to or smaller than the predetermined amount of light (the first threshold value), it is determined that wafers exist on the forks because the light is partially blocked by the wafers. However, the method of detecting the light blocking state is not limited thereto. The presence or absence of wafers on the fork 31a and the fork 32a may be determined based on the amounts of blocked light of the two light beams B1 and B2. In addition, the presence or absence of wafers on the fork 31a and the fork 32a may be determined depending on whether voltage values corresponding to the amounts of received light of the two light beams B1 and B2 are equal to or lower than a predetermined voltage.

According to the transfer detection method of the present embodiment, it is possible to determine not only the presence or absence of wafers on the forks 31a and 32a, but also states of wafers held on a plurality of forks. For example, in detecting warpage of a wafer, when an amount of received light is less than an amount of light received when the wafer is placed horizontally on a fork (or an amount of blocked light is less than the amount of light received when the wafer is placed horizontally on the fork) and when difference in the amount of received light (or difference in the amount of blocked light) is greater than a threshold value, it is determined that warpage of the wafer is large, and the wafer transfer is stopped.

In addition, in FIG. 8, when it is determined that an error has occurred, the wafer transfer is stopped, but the present disclosure is not limited thereto. When it is determined that an error has occurred, a Z-axis of the fork may be corrected such that the amount of received light becomes equal to or smaller than the first threshold value or the amount of blocked light is within a threshold value.

The load-lock chambers LLM1 and LLM2 according to the present embodiment are examples of a first chamber, and the vacuum transfer chamber VTM is an example of a second chamber adjacent to the first chamber. The first chambers are not limited to the load-lock chambers, and may be processing chambers PM1 to PM4 for processing a substrate. The second chamber may be a vacuum or atmospheric transfer chamber provided with a transfer device having a transfer arm. In addition, the loading and unloading port 15 via which the load-lock chambers LLM1 and LLM2 are brought into communication with the vacuum transfer chamber VTM is an example of an opening via which the first chamber is brought into communication with the second chamber.

There may be a single first chamber or a plurality of first chambers. When a plurality of first chambers is provided, the first chambers are arranged side by side in a lateral direction on a side of contact surfaces between the first chambers and the second chamber.

The optical sensor is installed in the vicinity of the opening. It is desirable that the optical sensor 2 is provided in the vacuum transfer chamber VTM for simplicity of the structure. However, the optical sensor 2 may be provided in each of the load-lock chambers LLM1 and LLM2.

Second Embodiment

[Configuration of Apparatus]

Figure 19:
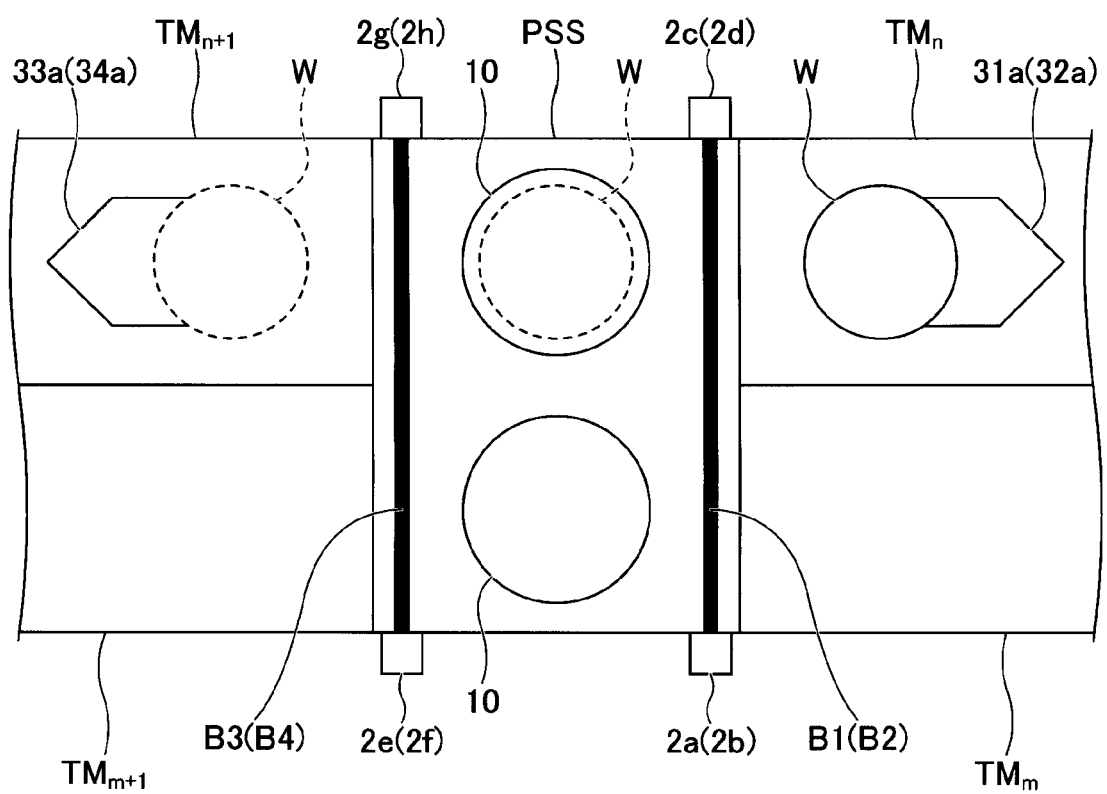
FIG. 19 is a view illustrating an exemplary substrate processing apparatus (part) according to a second embodiment.

Next, a part of the substrate processing apparatus 1 according to a second embodiment will be described with reference to FIG. 19. FIG. 19 is a top view illustrating an exemplary substrate processing apparatus 1 (part) according to a second embodiment. In the substrate processing apparatus 1 according to the first embodiment, the load-lock chambers LLM1 and LLM2 are defined as first chambers, and the vacuum transfer chamber VTM is defined as a second chamber. However, in the substrate processing apparatus 1 according to the second embodiment, a placement chamber PSS for securing a placement region is defined as a first chamber. A second chamber is a transfer chamber TM provided with a transfer arm, and the transfer chamber TM may be a vacuum transfer chamber VTM or an atmospheric transfer chamber. Similarly, the placement chamber PSS may be a vacuum placement chamber or an atmospheric placement chamber.

The placement chamber PSS is provided between transfer chambers $TM_n$ and $TM_m$ (n and m are positive integers), which are examples of the second chamber, and transfer chambers $TM_{n+1}$ and $TM_{m+1}$, which are examples of a third chamber different from the second chamber. The second chamber may be the transfer chambers $TM_{n+1}$ and $TM_{m+1}$, and the third chambers may be the transfer chambers $TM_{n+1}$ and $TM_m$. The placement chamber PSS has a plurality of stages 10 on each of which a wafer is placed. In the example of FIG. 19, two stages 10 are arranged side by side in the placement chamber PSS along a contact surface with the transfer chambers $TM_n$ and $TM_m$ or with the transfer chambers $TM_{n+1}$ and $TM_{m+1}$. The placement chamber PSS is in communication with the transfer chambers $TM_n$ and $TM_m$ via a loading and unloading port 15, and in communication with the transfer chambers $TM_{n+1}$ and $TM_{m+1}$ via a loading and unloading port 16 (see FIGS. 20A and 20B).

[Detection Process]

Next, a detection process during a wafer transfer according to the second embodiment will be described with reference to FIGS. 20A to 24B. FIGS. 20A to 24B are views illustrating a detection process according to the second embodiment. Here, transferring a wafer W between the transfer chamber $TM_n$ and the placement chamber PSS and transferring a wafer W between the placement chamber PSS and the transfer chamber $TM_{n+1}$ will be described as an example. The detection process is controlled by the controller 100.

Light projectors 2a and 2b of the optical sensor 2 illustrated in FIG. 19 are installed in upper and lower stages on an outer side wall of the placement chamber PSS on a side of the transfer chambers $TM_n$ and $TM_m$. Horizontal light beams B1 and B2 in the upper and lower stages projected from the light projectors 2a and 2b are received by light receivers 2c and 2d, respectively, via windows provided on side walls of the placement chamber PSS. Light projectors 2e and 2f are installed in upper and lower stages on the outer side wall of the placement chamber PSS on a side of the transfer chambers $TM_{n+1}$ and $TM_{m+1}$. Horizontal beams B3 and B4 in the upper and lower stages projected from the light projectors 2e and 2f are received by light receivers 2g and 2h, respectively, via windows provided on side walls of the placement chamber PSS. In this state, the detection process of FIG. 8 is started.

Figure 20A:
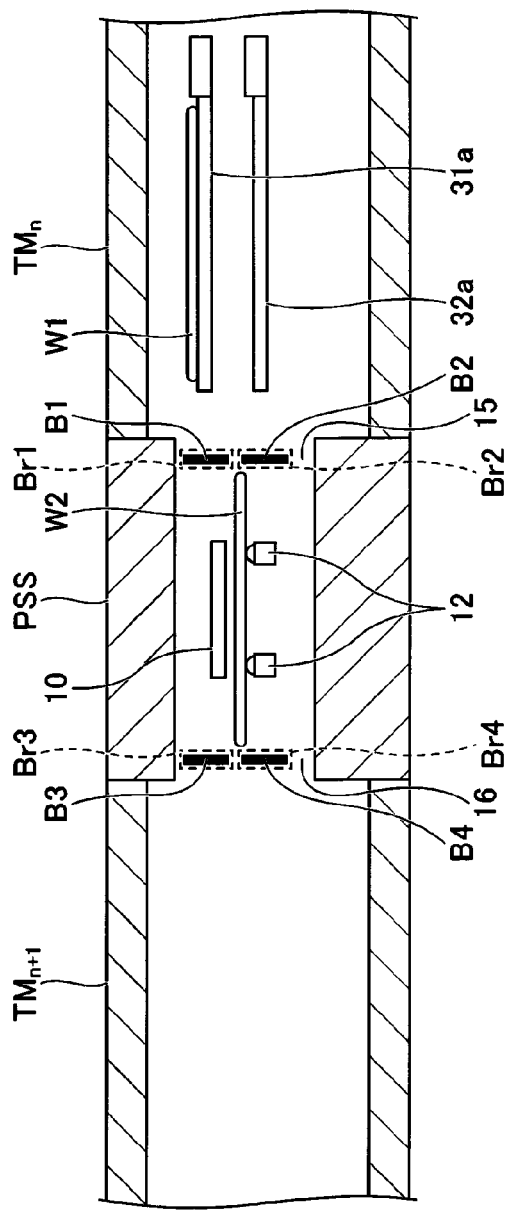
FIGS. 20A and 20B are views illustrating an example of loading and unloading of a wafer according to the second embodiment.

When the detection process is started, as illustrated in FIG. 20A, the controller 100 causes the fork 31a of the first transfer arm 31 and the fork 32a of the second transfer arm 32 to wait in the vicinity of the loading and unloading port 15 between the transfer chamber $TM_n$ and the placement chamber PSS. At this time point, a wafer W1 is held on the fork 31a inside the transfer chamber $TM_n$. In addition, a wafer W2 is held on the lifter pins 12 inside the placement chamber PSS.

Figure 20B:
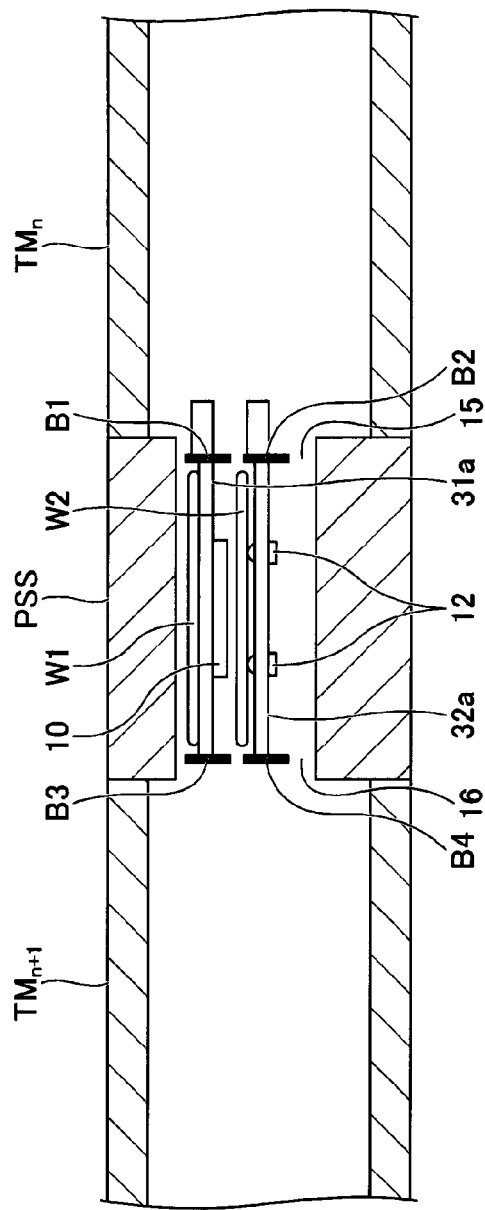

Subsequently, the controller 100 causes the fork 31a and the fork 32a to pass through detection regions Br1 and Br2 illustrated in FIG. 20A and to enter the placement chamber PSS as illustrated in FIG. 20B.

At this time, the controller 100 determines whether an amount of light L1 of the light beam B1 received by the light receiver 2c of the optical sensor is equal to or smaller than the first threshold value. When the amount of light L1 is determined to be equal to or smaller than the first threshold value, the controller 100 determines that a wafer is held on the fork 31a, and when the amount of light L1 is determined to be greater than the first threshold value, the controller 100 determines that no wafer is held on the fork 31a. When it is determined that no wafer is held on the fork 31a, the controller 100 determines that an error has occurred and stops the wafer transfer.

Similarly, the controller 100 determines whether an amount of light L2 of the light beam B2 received by the light receiver 2d is equal to or smaller than the first threshold value. When the amount of light L2 is determined to be equal to or smaller than the first threshold value, the controller 100 determines that a wafer is held on the fork 32a, and when the amount of light L2 is determined to be greater than the first threshold value, the controller 100 determines that no wafer is held on the fork 32a. When it is determined that a wafer is held on the fork 32a, the controller 100 determines that an error has occurred and stops the wafer transfer.

Figure 21A:
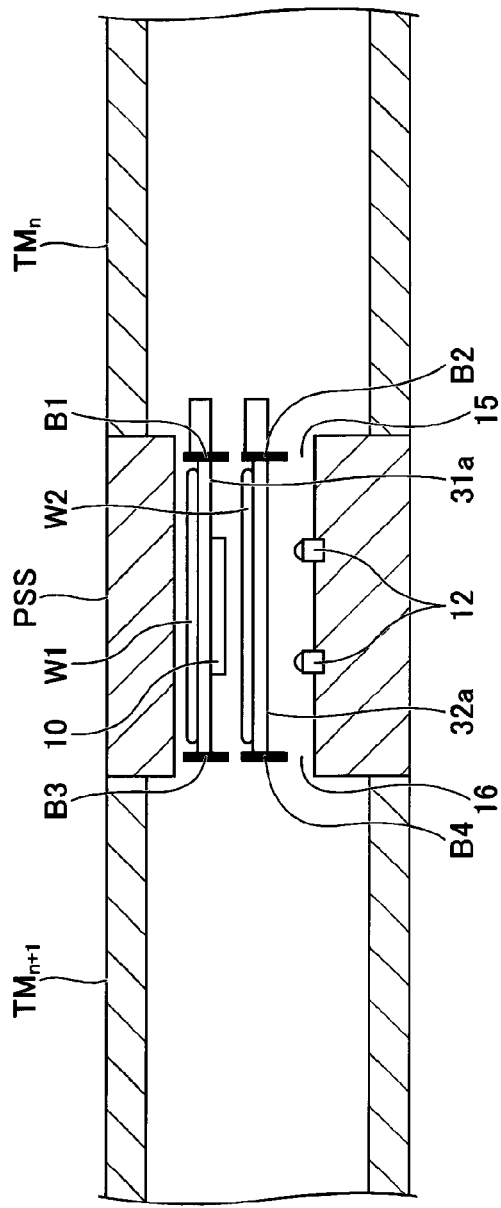
FIGS. 21A and 21B are views illustrating an example of loading and unloading of a wafer according to the second embodiment (continuation of FIGS. 20A and 20B)
Figure 21B:
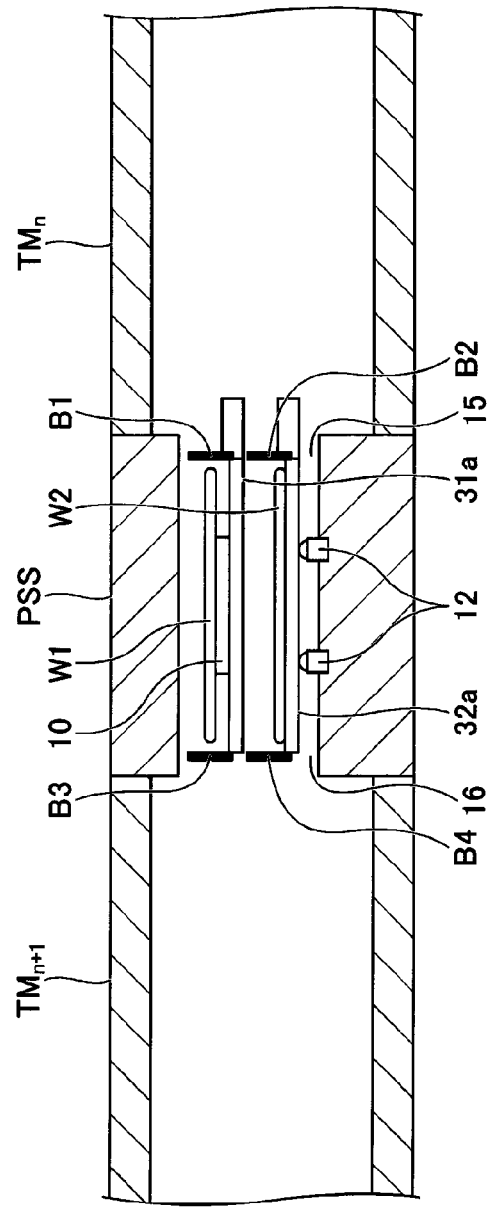
Figure 22A:
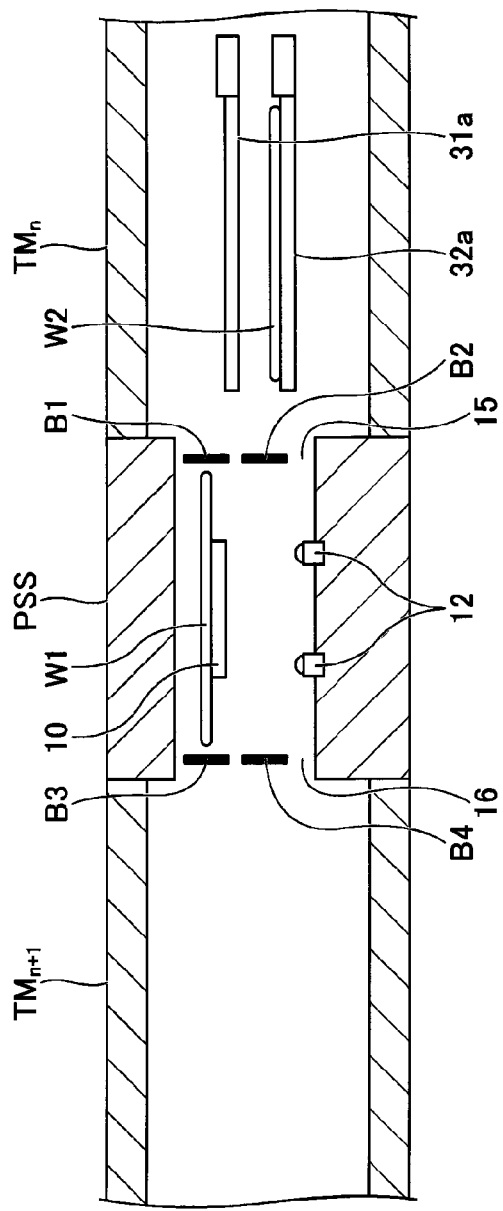
FIGS. 22A and 22B are views illustrating an example of loading and unloading of a wafer according to the second embodiment (continuation of FIGS. 21A and 21B).

Subsequently, as illustrated in FIG. 21A, the controller 100 moves the lifter pins 12 down in the placement chamber PSS and causes the wafer W2 to be held on the fork 32a. Thereafter, as illustrated in FIG. 21B, the controller 100 moves the fork 31a and the fork 32a down. Thus, it possible to cause the wafer W1 to be placed on the stage 10 and to cause the wafer W2 to be held on the fork 32a while avoiding interference between the wafer W2 and the fork 31a. Subsequently, as illustrated in FIG. 22A, the controller 100 causes the fork 31a and the fork 32a to pass through the light beams B1 and B2 and to be retracted from the placement chamber PSS to the transfer chamber $TM_n$. At this time, the controller 100 determines whether an amount of light L1 of the light beam B1 received by the light receiver 2c of the optical sensor is equal to or smaller than the first threshold value. When the amount of light L1 is determined to be equal to or smaller than the first threshold value, the controller 100 determines that a wafer is held on the fork 31a, and when the amount of light L1 is determined to be greater than the first threshold value, the controller 100 determines that no wafer is held on the fork 31a. When it is determined that a wafer is held on the fork 31a, the controller 100 determines that an error has occurred and stops the wafer transfer.

Similarly, the controller 100 determines whether an amount of light L2 of the light beam B2 received by the light receiver 2d of the optical sensor is equal to or smaller than the first threshold value. When the amount of light L2 is determined to be equal to or smaller than the first threshold value, the controller 100 determines that a wafer is held on the fork 32a, and when the amount of light L2 is determined to be greater than the first threshold value, the controller 100 determines that no wafer is held on the fork 32a. When it is determined that no wafer is held on the fork 32a, the controller 100 determines that an error has occurred and stops the wafer transfer.

Figure 22B:
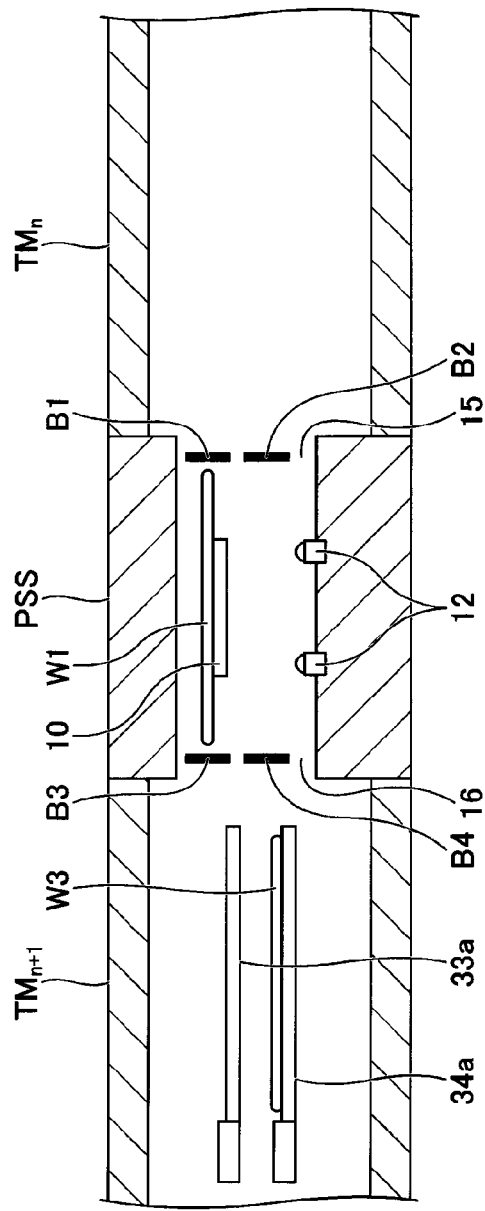

Subsequently, as illustrated in FIG. 22B, the controller 100 causes the fork 33a of the third transfer arm and the fork 34a of the fourth transfer arm to wait in the vicinity of the loading and unloading port 16 between the transfer chamber $TM_{n+1}$ and the placement chamber PSS. At this time point, the wafer W1 is placed on the stage 10 inside the placement chamber PSS. In addition, a wafer W3 is held on the fork 34a inside the transfer chamber $TM_{n+1}$.

Figure 23A:
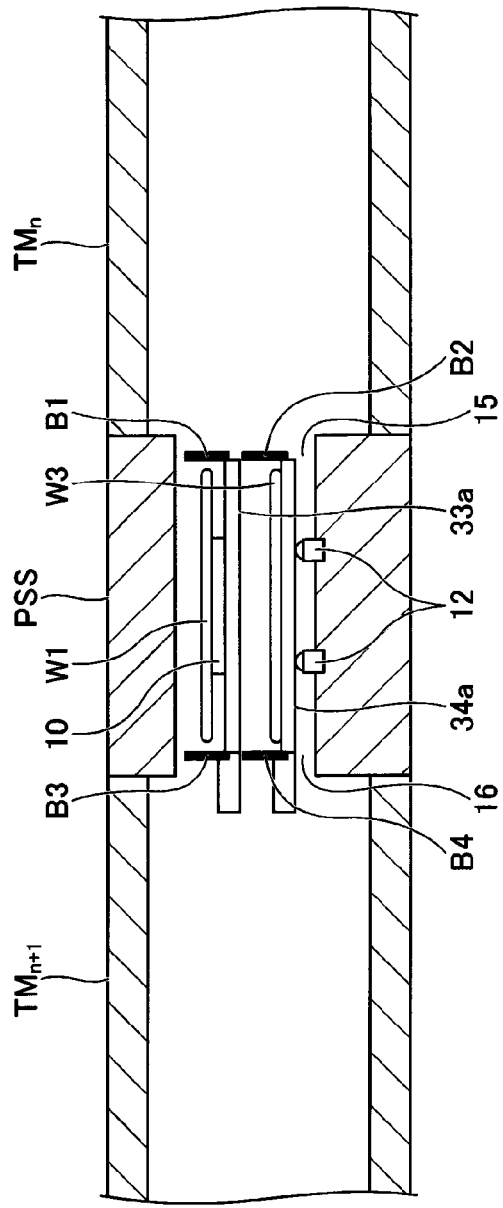
FIGS. 23A and 23B are views illustrating an example of loading and unloading of a wafer according to the second embodiment (continuation of FIGS. 22A and 22B).

Subsequently, as illustrated in FIG. 23A, the controller 100 causes the fork 33a in the upper stage and the fork 34a in the lower stage to pass through regions, through which the light beams B3 and B4 pass, and to enter the placement chamber PSS.

At this time point, the controller 100 determines whether an amount of light L3 of the light beam B3 received by the light receiver 2g is equal to or smaller than the first threshold value. When the amount of light L3 is determined to be equal to or smaller than the first threshold value, the controller 100 determines that a wafer is held on the fork 33a, and when the amount of light L3 is determined to be greater than the first threshold value, the controller 100 determines that no wafer is held on the fork 33a. At this time point, when it is determined that a wafer is held on the fork 33a, the controller 100 determines that an error has occurred and stops the wafer transfer.

Similarly, the controller 100 determines whether an amount of light L4 of the light beam B4 received by the light receiver 2h is equal to or smaller than the first threshold value. When the amount of light L4 is determined to be equal to or smaller than the first threshold value, the controller 100 determines that a wafer is held on the fork 34a, and when the amount of light L4 is determined to be greater than the first threshold value, the controller 100 determines that no wafer is held on the fork 34a. When it is determined that no wafer is held on the fork 34a, the controller 100 determines that an error has occurred and stops the wafer transfer.

Figure 23B:
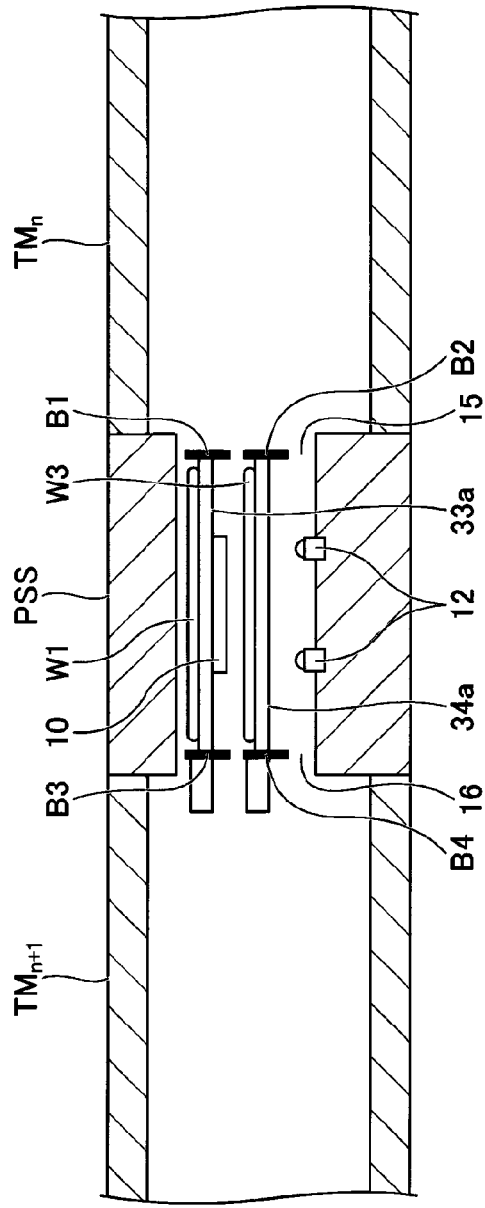

Subsequently, as illustrated FIG. 23B, the controller 100 raises the fork 31a and the fork 32a in the placement chamber PSS, and causes the fork 33a to hold the wafer W1. Thereafter, as illustrated in FIG. 24A, the controller 100 raises the lifter pins 12 to cause the lifter pins 12 to hold the wafer W3.

Subsequently, as illustrated in FIG. 24B, the controller 100 causes the fork 33a in the upper stage and the fork 32a in the lower stage to pass through the regions, through which the light beams B3 and B4 pass, and to be retracted from the placement chamber PSS to the transfer chamber $TM_{n+1}$.

At this time point, the controller 100 determines whether an amount of light L3 of the light beam B3 received by the light receiver 2g is equal to or smaller than the first threshold value. When the amount of light L3 is determined to be equal to or smaller than the first threshold value, the controller 100 determines that a wafer is held on the fork 33a, and when the amount of light L3 is determined to be greater than the first threshold value, the controller 100 determines that no wafer is held on the fork 33a. When it is determined that no wafer is held on the fork 33a, the controller 100 determines that an error has occurred and stops the wafer transfer.

Similarly, the controller 100 determines whether an amount of light L4 of the light beam B4 received by the light receiver 2h is equal to or smaller than the first threshold value. When the amount of light L4 is determined to be equal to or smaller than the first threshold value, the controller 100 determines that a wafer is held on the fork 34a, and when the amount of light L4 is determined to be greater than the first threshold value, the controller 100 determines that no wafer is held on the fork 34a. When it is determined that a wafer is held on the fork 34a, the controller 100 determines that an error has occurred and stops the wafer transfer. With the operations described above, unless an error occurs, the wafer W1 is transferred from the transfer chamber $TM_n$ to the placement chamber PSS, and the wafer W2 is transferred from the placement chamber PSS to the transfer chamber $TM_n$. Subsequently, the wafer W1 is transferred from the placement chamber PSS to the transfer chamber $TM_{n+1}$, and the wafer W3 is transferred from the transfer chamber $TM_{n+1}$ to the placement chamber PSS.

As described above, with the transfer detection process according to the second embodiment, it is possible to accurately detect a transfer state in the substrate processing apparatus 1 in which a plurality of wafers is transferred to upper and lower stages.

In addition, although the optical sensor 2 is arranged in the placement chamber PSS in the second embodiment, the optical sensor 2 may be provided at the transfer chamber $TM_n$ and the transfer chamber $TM_{n+1}$, as long as it is located in the vicinity of the loading and unloading ports 15 and 16.

It shall be understood that the transfer detection method and the substrate processing apparatus according to the embodiments disclosed herein are illustrative and not restrictive in all aspects. The above-described embodiments may be modified and improved in various forms without departing from the scope and spirit of the appended claims. The matters described in connection with the embodiments described above may take other configurations without contradiction, and may be combined without contradiction.

The substrate processing apparatus of the present disclosure is applicable to any of a capacitively coupled plasma (CCP) type, an inductively coupled plasma (ICP) type, a radial line slot antenna (RLSA) type, an electron cyclotron resonance plasma (ECR) type, and a helicon wave plasma (HWP) type.

In the present specification, the wafer W has been described as an example of a substrate. However, the substrate is not limited thereto, and may be any of various substrates used for a flat panel display (FPD), a printed circuit board, or the like.

The present international application claims priority based on Japanese Patent Application No. 2018-226866 filed on Dec. 3, 2018, the disclosure of which is incorporated herein in its entirety by reference.

EXPLANATION OF REFERENCE NUMERALS

1: substrate processing apparatus, 2: optical sensor, 10, 11: stage, 15: loading and unloading port, 30, 40: transfer device, 31: first transfer arm, 32: second transfer arm, 31a, 32a: fork, 50: alignment device, 100: controller, PM1 to PM4: processing chamber (chamber, second chamber), VTM: vacuum chamber (chamber, first chamber), LLM1, LLM2: load-lock chamber (chamber), EFEM: atmospheric chamber, LP1 to LP3: load port (chamber), GV1 to GV8: gate valve, PSS: placement chamber, C: carrier, W: wafer

What is claimed is:

1. A transfer detection method for use in a substrate processing apparatus including a transfer arm, which has a plurality of substrate holders and is configured to transfer a plurality of substrates to a plurality of stages between a first chamber and a second chamber adjacent to the first chamber by using the plurality of substrate holders, and an optical sensor provided in a vicinity of an opening via which the first and second chambers are in communication with each other, wherein the optical sensor includes a plurality of light projectors configured to project a plurality of light beams and a plurality of light receivers configured to receive the plurality of light beams, wherein the first chamber includes a plurality of processing chambers or a plurality of load-lock chambers, and wherein the plurality of processing chambers or the plurality of load-lock chambers are arranged along the second chamber, the method comprising:
projecting the plurality of light beams having a horizontal optical axis parallel to the opening to a position through which the substrates held by the plurality of substrate holders pass, the plurality of light beams being projected to cross an entire portion of the plurality of processing chambers or the plurality of load-lock chambers; and
determining at least one of a state of the substrates on the substrate holders and a state of the transfer arm, in response to a detection result of the plurality of light beams projected from the optical sensor.

2. The transfer detection method of claim 1, wherein the plurality of light beams corresponds to the number of substrate holders and each of the plurality of light beams has the horizontal optical axis in a plurality of stages in a vertical direction.

3. The transfer detection method of claim 2, wherein the second chamber is a transfer chamber in which the transfer arm is provided.

4. The transfer detection method of claim 1, wherein the determining the at least one of the state of the substrates on the substrate holders and the state of the transfer arm includes determining at least one of presence or absence of the substrates on the substrate holders, distortion of the substrates on the substrate holders, and distortion of the transfer arm.

5. The transfer detection method of claim 1, wherein the second chamber is a transfer chamber in which the transfer arm is provided.

6. The transfer detection method of claim 1, wherein the first chamber is provided between the second chamber and a third chamber different from the second chamber and having a substrate stage, and
wherein the second chamber is a transfer chamber in which the transfer arm is provided.

7. The transfer detection method of claim 6, wherein a plurality of substrate stages is arranged inside the first chamber along the second chamber and the third chamber.

8. The transfer detection method of claim 1, wherein the determining the at least one of the state of the substrates on the substrate holders and the state of the transfer arm includes determining at least one of presence or absence of the substrates on the substrate holders, distortion of the substrates on the substrate holders, and distortion of the transfer arm.

9. A substrate processing apparatus comprising:
a transfer arm having a plurality of substrate holders and configured to transfer a plurality of substrates to a plurality of stages between a first chamber and a second chamber adjacent to the first chamber by using the plurality of substrate holders;
an optical sensor provided in a vicinity of an opening via which the first and second chambers are in communication with each other; and
a controller,
wherein the optical sensor includes a plurality of light projectors configured to project a plurality of light beams and a plurality of light receivers configured to receive the plurality of light beams, wherein the first chamber includes a plurality of processing chambers or a plurality of load-lock chambers, and wherein the plurality of processing chambers or the plurality of load-lock chambers are arranged along the second chamber, wherein the controller performs a control to:

project the plurality of light beams having a horizontal optical axis parallel to the opening to a position through which the substrates held by the plurality of substrate holders pass, the plurality of light beams being projected to cross an entire portion of the plurality of processing chambers or the plurality of load-lock chambers; and determine at least one of a state the substrates on the substrate holders and a state of the transfer arm, in response to a detection result of the plurality of light beams projected from the optical sensor.

* * * * *